United States Patent
Hikmet et al.

(10) Patent No.: US 11,841,136 B2
(45) Date of Patent: Dec. 12, 2023

(54) HIGH INTENSITY LIGHT SOURCE WITH HIGH CRI

(71) Applicant: SIGNIFY HOLDING B.V., Eindhoven (NL)

(72) Inventors: Rifat Ata Mustafa Hikmet, Eindhoven (NL); Martinus Petrus Joseph Peeters, Weert (NL); Ties Van Bommel, Horst (NL); Olexandr Valentynovych Vdovin, Maarheeze (NL); Robert Van Asselt, Valkenswaard (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 17/636,091

(22) PCT Filed: Aug. 18, 2020

(86) PCT No.: PCT/EP2020/073069
§ 371 (c)(1),
(2) Date: Feb. 17, 2022

(87) PCT Pub. No.: WO2021/032721
PCT Pub. Date: Feb. 25, 2021

(65) Prior Publication Data
US 2022/0290841 A1    Sep. 15, 2022

(30) Foreign Application Priority Data

Aug. 20, 2019 (EP) .................................. 19192524
Oct. 10, 2019 (EP) .................................. 19202548

(51) Int. Cl.
*F21V 9/38*     (2018.01)
*F21Y 115/30*   (2016.01)
*F21Y 113/13*   (2016.01)

(52) U.S. Cl.
CPC ............ *F21V 9/38* (2018.02); *F21Y 2113/13* (2016.08); *F21Y 2115/30* (2016.08)

(58) Field of Classification Search
CPC ..... F21V 9/38; F21Y 2113/13; F21Y 2115/30
See application file for complete search history.

(56) References Cited

U.S. PATENT DOCUMENTS

2016/0084451 A1    3/2016  Annen et al.
2017/0263592 A1*   9/2017  Schmidt ................... F21V 9/30
(Continued)

FOREIGN PATENT DOCUMENTS

EP    3149108 A2     4/2017
EP    3149108 B1 *  12/2017 ............ C09K 11/02
(Continued)

*Primary Examiner* — Tracie Y Green

(57) ABSTRACT

The invention provides a light generating device (1000) configured to generate device light (1001), wherein the light generating device (1000) comprises a first light source (110), a first luminescent material (210), a second source (120) of second light (121), and a third light source (130), wherein: the first light source (110) is configured to generate blue first light source light (111) having a first peak wavelength $\lambda_1$ selected from the spectral wavelength range of 440-475 nm, wherein the first light source (110) is a first laser light source (10); the first luminescent material (210) is configured to convert at least part of the first light source light (111) into first luminescent material light (211) having an emission band having wavelengths in one or more of (a) the green spectral wavelength range and (b) the yellow spectral wavelength range, wherein the
first luminescent material (210) comprises a luminescent material of the type $A_3B_5O_{12}$:Ce, wherein A comprises one or more of Y, Gd, Tb and Lu, and wherein B comprises one or more of Al, Ga, and In, wherein A comprises at least Y, and wherein B comprises at least Al; the second source (120) of second light (121) is configured to provide the second (Continued)

light (121) having an emission band having a dominant wavelength or peak wavelength in the spectral wavelength range of 580-610 nm; the third light source (130) is configured to generate red third light source light (131) having a third peak wavelength $\lambda_3$ selected from the spectral wavelength range of 630-670 nm, wherein the third light source (130) is a third laser light source (30); the light generating device (1000) is configured to provide in a first operational mode white device light (1001) comprising the first light source light (111), the first luminescent material light (211), the second light (121), and the third light source light (131), with a correlated color temperature selected from the range of 2000-5000 K and a color rendering index (CRI) of at least 80.

15 Claims, 10 Drawing Sheets

(56) References Cited

U.S. PATENT DOCUMENTS

| | | | |
|---|---|---|---|
| 2018/0087722 | A1 | 3/2018 | Ooi et al. |
| 2018/0316160 | A1 | 11/2018 | Raring et al. |
| 2019/0148605 | A1 | 5/2019 | Mu et al. |
| 2022/0341550 | A1* | 10/2022 | Hikmet ............... F21K 9/64 |

FOREIGN PATENT DOCUMENTS

| | | | |
|---|---|---|---|
| WO | 2006054203 | A1 | 5/2006 |
| WO | 2012135744 | A2 | 10/2012 |
| WO | 2016146688 | A1 | 9/2016 |

\* cited by examiner

HIGH INTENSITY LIGHT SOURCE WITH HIGH CRI

CROSS-REFERENCE TO PRIOR APPLICATIONS

This application is the U.S. National Phase application under 35 U.S.C. § 371 of International Application No. PCT/EP2020/073069, filed on Aug. 18, 2020, which claims the benefit of European Patent Application No. 19192524.7, filed on Aug. 20, 2019, and European Patent Application No. 19202548.4, filed on Oct. 10, 2019. These applications are hereby incorporated by reference herein.

FIELD OF THE INVENTION

The invention relates to a light generating device and to a luminaire comprising such light generating device.

BACKGROUND OF THE INVENTION

White light sources using a laser diode and a phosphor are known in the art. US2018/0316160, for instance, describes a device and a method for an integrated white colored electromagnetic radiation source using a combination of laser diode excitation sources based on gallium and nitrogen containing materials and light emitting source based on phosphor materials. A violet, blue, or other wavelength laser diode source based on gallium and nitrogen materials may be closely integrated with phosphor materials, such as yellow phosphors, to form a compact, high-brightness, and highly efficient, white light source. The phosphor material is provided with a plurality of scattering centers scribed on an excitation surface or inside bulk of a plate to scatter electromagnetic radiation of a laser beam from the excitation source incident on the excitation surface to enhance generation and quality of an emitted light from the phosphor material for outputting a white light emission either in reflection mode or transmission mode.

SUMMARY OF THE INVENTION

While white LED sources can give an intensity of e.g. up to about 300 lm/mm$^2$; static phosphor converted laser white sources can give an intensity even up to about 20,000 lm/mm$^2$. Ce doped garnets (e.g. YAG, LuAG) may be the most suitable luminescent convertors which can be used for pumping with blue laser light as the garnet matrix has a very high chemical stability. Further, at low Ce concentrations (e.g. below 0.5%) temperature quenching may only occur above about 200° C. Furthermore, emission from Ce has a very fast decay time so that optical saturation can essentially be avoided. In applications, such as automotive, correlated color temperatures above about 5000 K at low CRI are desirable. However, in other applications e.g. light sources with a high CRI, like e.g. at least 90, and a relatively low CCT, like e.g. at maximum 3000 K, may be desirable. For instance, in some applications an intensity higher than 1 GCd/m$^2$ with CRI≥90 and at lower CCT≤3000K appear desirable. It appears inevitable to use a laser diode light with an emission wavelength around 620 nm in combination with a YAG-type phosphor. However, diode lasers emitting at such wavelengths appear to be relatively very inefficient. Hence, it is an aspect of the invention to provide an alternative light generating device, which preferably further at least partly obviates one or more of above-described drawbacks. The present invention may have as object to overcome or ameliorate at least one of the disadvantages of the prior art, or to provide a useful alternative.

In a first aspect, the invention provides a light generating device ("device" or "lighting device") configured to generate device light ("light generating device light"). The light generating device comprises a first light source, a first luminescent material, a second source of second light, and a third light source. The first light source is especially configured to generate blue first light source light having a first peak wavelength $\lambda_1$, in specific embodiments selected from the spectral wavelength range of 440-475 nm. In yet further specific embodiments, the first light source is a first laser light source. The first luminescent material is especially configured to convert at least part of the first light source light into first luminescent material light having an emission band having wavelengths in one or more of (a) the green spectral wavelength range and (b) the yellow spectral wavelength range. In specific embodiments, the first luminescent material comprises a luminescent material of the type $A_3B_5O_{12}$:Ce, wherein A may comprise one or more of Y, Gd, Tb and Lu, and wherein B may comprise one or more of Al, Ga, and In, wherein A comprises at least Y, and wherein B comprises at least Al. The second source of second light is especially configured to provide the second light having an emission band having a peak wavelength or dominant wavelength in the amber and/or orange, in specific embodiments having a peak wavelength or dominant wavelength in the spectral wavelength range of 580-610 nm. The third light source is especially configured to generate red third light source light having a third peak wavelength $\lambda_3$, in specific embodiments selected from the spectral wavelength range of 625-670 nm, even more especially 630-670 nm. In yet further specific embodiments, the third light source is a third laser light source. Further, in specific embodiments the light generating device is configured to provide in a first operational mode white device light comprising the first light source light, the first luminescent material light, the second light, and the third light source light. Yet more especially, the white device light (in the first operational mode) has a correlated color temperature (CCT) in embodiments selected from the range of 2000-5000 K, such as 2000-4000 K, and/or in embodiments a color rendering index (CRI) selected from the rang of at least 75, such as more especially at least 80, like even at least 85, such as even at least 90. Hence, especially the invention provides a light generating device configured to generate device light, wherein the light generating device comprises a first light source, a first luminescent material, a second source of second light, and a third light source, wherein: (a) the first light source is configured to generate blue first light source light having a first peak wavelength $\lambda_1$ selected from the spectral wavelength range of 440-475 nm, wherein the first light source comprises (or in embodiments is) a first laser light source; (b) the first luminescent material is configured to convert at least part of the first light source light into first luminescent material light having an emission band having wavelengths in one or more of (a) the green spectral wavelength range and (b) the yellow spectral wavelength range, wherein the first luminescent material comprises a luminescent material of the type $A_3B_5O_{12}$:Ce, wherein A comprises one or more of Y, Gd, Tb and Lu, and wherein B comprises one or more of Al, Ga, and In, wherein A comprises at least Y, and wherein B comprises at least Al; (c) the second source of second light is configured to provide the second light having an emission band having a dominant wavelength or peak wavelength in the spectral wavelength range of 580-610 nm; (d) the third light source is configured to generate red third light source light having a third peak wavelength $\lambda_2$ selected from the spectral wavelength range of 625-670 nm, even more especially 630-670 nm, wherein the third light source comprises (or in embodiments is) a third laser light source; and (e) the light generating device is configured to provide in a first operational mode white device light comprising the first light source light, the first luminescent material light, the second light, and the third light source light, with a correlated color temperature selected from the range of 2000-5000 K, such as 2000-4000 K, and a color rendering index selected from the rang of at least 80.

With such device it is possible to provide white light with a relatively high intensity and with a relatively broad range of correlated color temperature and with a relatively high color rendering index, such as at least 75, like even about 80, or even above, such as at least 85. It is also possible to have such high color rendering index at relatively low CCT, such as at 3000 K or lower.

As indicated above, the light generating device is configured to generate device light. To this end, the light generating device comprises a first light source, a first luminescent material, a second source of second light, and a third light source. Here below, first some aspects in relation to the second source of second light are described, then some aspects in relation to (solid state) light sources are described, including an optional amber and/or orange (solid state) light source, followed by some aspects in relation the first luminescent material and an optional second luminescent material.

As indicated above, the second source of second light is configured to provide the second light having an emission band having a dominant wavelength or peak wavelength in the spectral wavelength range of 580-610 nm, especially about 595 nm±5 nm.

Especially, in first embodiments the second source of second light comprises a second laser light source (see further also below). The second laser light source is especially configured to generate second laser light source light. The second light may in embodiments essentially consist of the second laser light source light. Hence, in embodiments the second source of second light is a second laser light source. In embodiments, the term "second source of second light" may also refer to a plurality of the same second source of second lights. In embodiments, a bank of second laser light sources may be applied. Alternatively or additionally, the term "second source of second light" may also refer to a plurality of different second sources of second light. In embodiments, the term "second laser light source" may also refer to a plurality of the same second laser light sources. Alternatively or additionally, the term "second laser light source" may also refer to a plurality of different second laser light sources.

Alternatively or additionally, in second embodiments, the second source of second light comprises a second luminescent material (see further also below). The second luminescent material is configured to generate second luminescent material light based on conversion of the first luminescent material light (see below) and/or the first light source light. The second light may in embodiments essentially consist of the second luminescent material light. Hence, in embodiments the second source of second light is a second luminescent material light. In embodiments, the term "second source of second light" may also refer to a plurality of different second luminescent materials.

In yet further specific (third) embodiments, the second source of second light comprises the second laser light source (as amongst others defined above) and the second luminescent material (as amongst others defined above). The second laser light source and the second luminescent material may especially be configured to generate second light comprising second laser light source light and second luminescent material light. The second light may in embodiments essentially consist of the second laser light source light and the second luminescent material light.

As indicated above, in embodiments the light generating device comprises a first light source configured to generate blue first light source light. Hence, the first light source light may have a color point in the blue. Especially, the first light source comprises a first laser light source. The first laser light source is especially configured to generate first laser light source light. The first light source light may in embodiments essentially consist of the first laser light source light. Hence, in embodiments the first light source is a first laser light source. In embodiments, the term "first light source" may also refer to a plurality of the same first light sources. In embodiments, a bank of first laser light sources may be applied. Alternatively or additionally, the term "first light source" may also refer to a plurality of different first light sources. In embodiments, the term "first laser light source" may also refer to a plurality of the same first laser light sources. Alternatively or additionally, the term "first laser light source" may also refer to a plurality of different first laser light sources.

As indicated above, the light generating device comprises a second source of second light configured to generate second light in the amber and/or orange. Hence, the second source of second light has a color point in amber and/or orange. The phrase "amber and/or orange" as the spectral ranges of amber and orange may overlap (see also below).

As indicated above, in embodiments the light generating device comprises a second laser light source configured to generate amber and/or orange second laser light source light. Hence, the second laser light source light may have a color point in the amber and/or orange. The second laser light source is especially configured to generate second laser light source light. The second laser light source light may in embodiments essentially consist of the second laser light source light. In embodiments, the term "second laser light source" may also refer to a plurality of the same second laser light sources. In embodiments, a bank of second laser light sources may be applied. Alternatively or additionally, the term "second laser light source" may also refer to a plurality of different second laser light sources. In embodiments, the term "second laser light source" may also refer to a plurality of the same second laser light sources. Alternatively or additionally, the term "second laser light source" may also refer to a plurality of different second laser light sources.

As indicated above, the light generating device comprises a third light source configured to generate red third light source light. Hence, the third light source light has a color point in the red. Especially, the third light source comprises a third laser light source. The third laser light source is especially configured to generate third laser light source light. The third light source light may in embodiments essentially consist of the third laser light source light. Hence, in embodiments the third light source is a third laser light source. In embodiments, the term "third light source" may also refer to a plurality of the same third light sources. In embodiments, a bank of third laser light sources may be applied. Alternatively or additionally, the term "third light source" may also refer to a plurality of different third light sources. In embodiments, the term "third laser light source" may also refer to a plurality of the same third laser light sources. Alternatively or additionally, the term "third laser light source" may also refer to a plurality of different third laser light sources.

In embodiments, laser light sources may be arranged in a laser bank. The laser bank may in embodiments comprise heat sinking and/or optics e.g. a lens to collimate the laser light. A laser bank may e.g. comprise at least 10, such as at least 20 laser light sources. In embodiments the laser bank may comprise first light source. Alternatively or additionally, the laser bank may comprise second laser light source. Alternatively or additionally, the laser bank may comprise third light sources.

Herein, the terms "violet light" or "violet emission" especially relates to light having a wavelength in the range of about 380-440 nm. The terms "blue light" or "blue emission" especially relates to light having a wavelength in the range of about 440-495 nm (including some violet and cyan hues). The terms "green light" or "green emission" especially relate to light having a wavelength in the range of about 495-570 nm. The terms "yellow light" or "yellow emission" especially relate to light having a wavelength in the range of about 570-590 nm. The terms "orange light" or "orange emission" especially relate to light having a wavelength in the range of about 590-620 nm. The term "amber" may refer to one or more wavelengths selected from the range of about 585-605 nm, such as about 590-600 nm. The terms "red light" or "red emission" especially relate to light having a wavelength in the range of about 620-780 nm. The term "pink light" or "pink emission" refers to light having a blue and a red component. The terms "visible", "visible light" or "visible emission" and similar terms refer to light having one or more wavelengths in the range of about 380-780 nm.

Here below, some aspects in relation to the first light source, the second laser light source, and the third light source, are discussed. The first light source, the second laser light source, and the third light source, may be individually chosen and are thus not necessarily of the same type (notwithstanding the fact that the first light source, second source of light (especially the second laser light source), and the third light source are by definition different as the spectral power distributions mutually differ). Hence, the spectral power distributions of the first light source light, the second laser light source, and the third light source light mutually differ.

In specific embodiments, colors or color points (or spectral power distributions) of a first type of light and a second type of light may be different when the respective color points of the first type of light and the second type of light differ with at least 0.01 for u' and/or with least 0.01 for v', even more especially at least 0.02 for u' and/or with least 0.02 for v'. In yet more specific embodiments, the respective color points of first type of light and the second type of light may differ with at least 0.03 for u' and/or with least 0.03 for v'. Here, u' and v' are color coordinate of the light in the CIE 1976 UCS (uniform chromaticity scale) diagram.

The term "light source" may refer to a semiconductor light-emitting device, such as a light emitting diode (LEDs), a resonant cavity light emitting diode (RCLED), a vertical cavity laser diode (VCSELs), an edge emitting laser, etc. . . . The term "light source" may also refer to an organic light-emitting diode, such as a passive-matrix (PMOLED) or an active-matrix (AMOLED). In a specific embodiment, the light source comprises a solid-state light source (such as a LED or laser diode). In an embodiment, the light source comprises a LED (light emitting diode). The term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of semiconductor light sources may be configured on the same substrate. In embodiments, a COB is a multi LED chip configured together as a single lighting module. The term "light source" may also relate to a plurality of (essentially identical (or different)) light sources, such as 2-2000 solid state light sources. In embodiments, the light source may comprise one or more micro-optical elements (array of micro lenses) downstream of a single solid-state light source, such as a LED, or downstream of a plurality of solid-state light sources (i.e. e.g. shared by multiple LEDs). In embodiments, the light source may comprise a LED with on-chip optics. In embodiments, the light source comprises a pixelated single LEDs (with or without optics) (offering in embodiments on-chip beam steering). The term "laser light source" especially refers to a laser. Such laser may especially be configured to generate laser light source light having one or more wavelengths in the UV, visible, or infrared, especially having a wavelength selected from the spectral wavelength range of 200-2000 nm, such as 300-1500 nm. The term "laser" especially refers to a device that emits light through a process of optical amplification based on the stimulated emission of electromagnetic radiation. Especially, in embodiments the term "laser" may refer to a solid-state laser.

Hence, in embodiments the light source comprises a laser light source. In embodiments, the terms "laser" or "solid state laser" may refer to one or more of cerium doped lithium strontium (or calcium) aluminum fluoride (Ce:LiSAF, Ce:LiCAF), chromium doped chrysoberyl (alexandrite) laser, chromium ZnSe (Cr:ZnSe) laser, divalent samarium doped calcium fluoride ($Sm:CaF_2$) laser, Er:YAG laser, erbium doped and erbium-ytterbium codoped glass lasers, F-Center laser, holmium YAG (Ho:YAG) laser, Nd:YAG laser, NdCrYAG laser, neodymium doped yttrium calcium oxoborate $Nd:YCa_4O(BO_3)_3$ or Nd:YCOB, neodymium doped yttrium orthovanadate ($Nd:YVO_4$) laser, neodymium glass (Nd:glass) laser, neodymium YLF (Nd:YLF) solid-state laser, promethium 147 doped phosphate glass (147 $Pm^{3+}$:glass) solid-state laser, ruby laser ($Al_2O_3$:$Cr^{3+}$), thulium YAG (Tm:YAG) laser, titanium sapphire (Ti:sapphire; $Al_2O_3$:$Ti^{3+}$) laser, trivalent uranium doped calcium fluoride (U:$CaF_2$) solid-state laser, Ytterbium doped glass laser (rod, plate/chip, and fiber), Ytterbium YAG (Yb:YAG) laser, $Yb_2O_3$ (glass or ceramics) laser, etc. In embodiments, the terms "laser" or "solid state laser" may refer to one or more of a semiconductor laser diode, such as GaN, InGaN, AlGaInP, AlGaAs, InGaAsP, lead salt, vertical cavity surface emitting laser (VCSEL), quantum cascade laser, hybrid silicon laser, etc.

As can be derived from the below, the term "laser light source" may also refer to a plurality of (different or identical) laser light sources. In specific embodiments, the term "laser light source" may refer to a plurality N of (identical) laser light sources. In embodiments, N=2, or more. In specific embodiments, N may be at least 5, such as especially at least 8. In this way, a higher brightness may be obtained. In embodiments, laser light sources may be arranged in a laser bank (see also above). The laser bank may in embodiments comprise heat sinking and/or optics e.g. a lens to collimate the laser light.

The laser light source is configured to generate laser light source light (or "laser light"). The light source light may essentially consist of the laser light source light. The light source light may also comprise laser light source light of two or more (different or identical) laser light sources. For instance, the laser light source light of two or more (different or identical) laser light sources may be coupled into a light guide, to provide a single beam of light comprising the laser light source light of the two or more (different or identical) laser light sources. In specific embodiments, the light source light is thus especially collimated light source light. In yet further embodiments, the light source light is especially (collimated) laser light source light. The phrases "different light sources" or "a plurality of different light sources", and similar phrases, may in embodiments refer to a plurality of solid-state light sources selected from at least two different bins. Likewise, the phrases "identical light sources" or "a plurality of same light sources", and similar phrases, may in embodiments refer to a plurality of solid-state light sources selected from the same bin.

The light source is especially configured to generate light source light having an optical axis (O), (a beam shape,) and a spectral power distribution. The light source light may in embodiments comprise one or more bands, having band widths as known for lasers. In specific embodiments, the band(s) may be relatively sharp line(s), such as having full width half maximum (FWHM) in the range of less than 20 nm at RT, such as equal to or less than 10 nm. Hence, the light source light has a spectral power distribution (intensity on an energy scale as function of the wavelength) which may comprise one or more (narrow) bands.

The beams (of light source light) may be focused or collimated beams of (laser) light source light. The term "focused" may especially refer to converging to a small spot. This small spot may be at the discrete converter region, or (slightly) upstream thereof or (slightly) downstream thereof. Especially, focusing and/or collimation may be such that the cross-sectional shape (perpendicular to the optical axis) of the beam at the discrete converter region (at the side face) is essentially not larger than the cross-section shape (perpendicular to the optical axis) of the discrete converter region (where the light source light irradiates the discrete converter region). Focusing may be executed with one or more optics, like (focusing) lenses. Especially, two lenses may be applied to focus the laser light source light. Collimation may be executed with one or more (other) optics, like collimation elements, such as lenses and/or parabolic mirrors. In embodiments, the beam of (laser) light source light may be relatively highly collimated, such as in embodiments ≤2° (FWHM), more especially ≤1° (FWHM), most especially ≤0.5° (FWHM). Hence, ≤2° (FWHM) may be considered (highly) collimated light source light. Optics may be used to provide (high) collimation (see also above).

As indicated above, in embodiments the first light source light may essentially consist of the laser light source light. In further specific embodiments, the first light source light may essentially consist of first laser light source light of one or more essentially identical laser light sources (such as from the same bin). Further, as indicated above, in (first) embodiments the second light may essentially consist of second laser light. In further specific embodiments, the second laser light may essentially consist of second laser light source light of one or more essentially identical laser light sources (such as from the same bin). Further, as indicated above, in embodiments the third light source light may essentially consist of the laser light source light. In further specific embodiments, the third light source light may essentially consist of third laser light source light of one or more essentially identical laser light sources (such as from the same bin).

In specific embodiments, the first light source is configured to generate blue first light source light having a first peak wavelength $\lambda_1$ selected from the spectral wavelength range of 440-475 nm. As indicated above, the first light source is especially a first laser light source. Especially then, (the configuration may be chosen such that) conversion by the luminescent material (see also below) is less than 100%. Hence, at least part of the first light source light may be available in the device light. In specific embodiments, the first peak wavelength may be selected from the spectral wavelength range of 450-470 nm, especially selected from the spectral wavelength range of 455-470 nm. The wavelength around 460 nm appears surprisingly to provide, especially in combination with the first luminescent material light, the second light, and the third light source light, relatively high CRI and/or desirable color temperatures in a relatively efficient way.

In specific embodiments, the second source of second light comprises a second laser light source configured to generate second laser light source light. In yet further specific embodiments, the second laser light source light has a second peak wavelength $\lambda_2$ selected from the spectral wavelength range of 580-610 nm, even more especially 590-600 nm, like selected from the spectral wavelength range of 595 nm±2 nm. The wavelength around 595 nm appears surprisingly to provide, especially in combination with the first luminescent material light, the first light source light, and the third light source light, relatively high CRI and/or desirable color temperatures in a relatively efficient way.

In specific embodiments, the third light source is configured to generate red third light source light having a third peak wavelength $\lambda_3$, in specific embodiments selected from the spectral wavelength range of 625-670 nm, even more especially 630-670 nm. As indicated above, especially the third light source is a third laser light source. In specific embodiments, the third peak wavelength $\lambda_3$ is selected from the spectral wavelength range of 630-650 nm, even more especially 635-650 nm, like especially selected from the spectral wavelength range of 640 nm±5 nm. The wavelength around 640 nm appears surprisingly to provide, especially in combination with the first luminescent material light, the first light source light, and the second light, relatively high CRI and/or desirable color temperatures in a relatively efficient way.

As indicated above, the light generating device comprises a first luminescent material. Optionally, the light generating device may also comprise a second luminescent material. General remarks (embodiments) below in relation to the first luminescent material may also apply to the second luminescent material (and vice versa).

The term "luminescent material" herein especially relates to inorganic luminescent materials, which are also sometimes indicated as phosphors. These terms are known to the person skilled in the art.

In embodiments, quantum dots and/or organic dyes may be applied, and may optionally be embedded in transmissive matrices like e.g. polymers, like PMMA, or polysiloxanes, etc. etc . . . . Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with a shell such as cadmium sulfide (CdS) and zinc sulfide (ZnS). Cadmium free quantum dots such as indium phosphide (InP), and copper indium sulfide ($CuInS_2$) and/or silver indium sulfide ($AgInS_2$) can also be used. Quantum dots show very narrow emission band and thus they show saturated colors. Furthermore, the emission color can easily be tuned by adapting the size of the quantum dots. Any type of quantum dot known in the art may be used in the present invention. However, it may be preferred for reasons of environmental safety and concern to use cadmium-free quantum dots or at least quantum dots having a very low cadmium content. Instead of quantum dots or in addition to quantum dots, also other quantum confinement structures may be used. The term "quantum confinement structures" should, in the context of the present application, be understood as e.g. quantum wells, quantum dots, quantum rods, tripods, tetrapods, or nanowires, etcetera. Organic phosphors can be used as well. Examples of suitable organic phosphor materials are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen® F170.

As indicated above, the light generating device especially further comprises a first luminescent material configured to convert at least part of the first light source light into first luminescent material light having an emission band having wavelengths in one or more of (a) the green spectral wavelength range and (b) the yellow spectral wavelength range.

The term "luminescent material" especially refers to a material that can convert first radiation, especially (one or more of UV radiation and) blue radiation, into second radiation. In general, the first radiation and second radiation have different spectral power distributions. Hence, instead of the term "luminescent material", also the terms "luminescent converter" or "converter" may be applied. In general, the second radiation has a spectral power distribution at larger wavelengths than the first radiation, which is the case in the so-called down-conversion. In specific embodiments, however the second radiation has a spectral power distribution with intensity at smaller wavelengths than the first radiation, which is the case in the so-called up-conversion. In embodiments, the "luminescent material" may especially refer to a material that can convert radiation into e.g. visible and/or infrared light. For instance, in embodiments the luminescent material may be able to convert one or more of UV radiation and blue radiation, into visible light. The luminescent material may in specific embodiments also convert radiation into infrared radiation (IR). Hence, upon excitation with radiation, the luminescent material emits radiation. In general, the luminescent material will be a down converter, i.e. radiation of a smaller wavelength is converted into radiation with a larger wavelength ($\lambda_{ex} < \lambda_{em}$), though in specific embodiments the luminescent material may comprise down-converter luminescent material, i.e. radiation of a larger wavelength is converted into radiation with a smaller wavelength ($\lambda_{ex} > \lambda_{em}$). In embodiments, the term "luminescence" may refer to phosphorescence. In embodiments, the term "luminescence" may also refer to fluorescence. Instead of the term "luminescence", also the term "emission" may be applied. Hence, the terms "first radiation" and "second radiation" may refer to excitation radiation and emission (radiation), respectively. Likewise, the term "luminescent material" may in embodiments refer to phosphorescence and/or fluorescence. The term "luminescent material" may also refer to a plurality of different luminescent materials. The term "luminescent material" herein may also refer to a material comprising a luminescent material, such as a light transmissive host comprising the luminescent material.

Especially, the first luminescent material is configured to convert part of the blue first light source light into first luminescent material light having an emission band having wavelengths in one or more of the green and yellow. Further, especially the first luminescent material light has one or more wavelengths in the range of about 500-700 nm. Further, in specific embodiments the first luminescent material light has a full width half maximum (FWHM) of at least 50 nm, such as at least 75 nm, like in specific embodiments up to about 130 nm (at room temperature). A broad band may provide a higher CRI. Especially, the first luminescent material light has a color point in the green or yellow, especially in the yellow. Especially, in embodiments the first luminescent material light has a dominant wavelength ($\lambda_{d1}$) selected from the spectral wavelength range of 540-580 nm, more especially selected from the spectral wavelength range of 555-580 nm. Especially, at least 85% of the spectral power (in Watt) of the first luminescent material light, such as at least 90%, is within the range of 500-700 nm. Hence, especially the first luminescent material is configured to emit first luminescent material light at least having one or more wavelengths in the (green and/or) yellow.

Especially good results in terms of CRI and CCT range appear to be achievable with cerium doped garnet type materials. Hence, in specific embodiments the first luminescent material comprises a luminescent material of the type $A_3B_5O_{12}$:Ce, wherein A in embodiments comprises one or more of Y, Gd, Tb and Lu, and wherein B in embodiments comprises one or more of Al, Ga, and In. Hence, especially suitable luminescent materials are cerium comprising garnet materials. Embodiments of garnets especially include $A_3B_5O_{12}$ garnets, wherein A comprises at least yttrium or lutetium and wherein B comprises at least aluminum. Such garnets may be doped with cerium (Ce), with praseodymium (Pr) or a combination of cerium and praseodymium; especially however with Ce. Especially, B comprises aluminum (Al), however, B may also partly comprise gallium (Ga) and/or scandium (Sc) and/or indium (In), especially up to about 20% of Al, more especially up to about 10% of Al (i.e. the B ions essentially consist of 90 or more mole % of Al and 10 or less mole % of one or more of Ga, Sc and In); B may especially comprise up to about 10% gallium. In another variant, B and O may at least partly be replaced by Si and N. The element A may especially be selected from the group consisting of yttrium (Y), gadolinium (Gd), terbium (Tb) and lutetium (Lu). Further, Gd and/or Tb are especially only present up to an amount of about 20% of A. In a specific embodiment, the garnet luminescent material comprises $(Y_{1-x}Lu_x)_3B_5O_{12}$:Ce, wherein x is equal to or larger than 0 and equal to or smaller than 1. The term ":Ce", indicates that part of the metal ions (i.e. in the garnets: part of the "A" ions) in the luminescent material is replaced by Ce. For instance, in the case of $(Y_{1-x}Lu_x)_3Al_5O_{12}$:Ce, part of Y and/or Lu is replaced by Ce. This is known to the person skilled in the art. Ce will replace A in general for not more than 10%; in general, the Ce concentration will be in the range of 0.1 to 4%, especially 0.1 to 2% (relative to A). Assuming 1% Ce and 10% Y, the full correct formula could be $(Y_{0.1}Lu_{0.89}Ce_{0.01})_3Al_5O_{12}$. Ce in garnets is substantially or only in the trivalent state, as is known to the person skilled in the art. In specific embodiments the luminescent material comprises $(Y_{x1-x2-x3}A_{x2}Ce_{x3})_3(Al_{y1-y2}B_{y2})_5O_{12}$, wherein x1+x2+x3=1, wherein x3>0, wherein 0<x2+x3≤0.2, wherein y1+y2=1, wherein 0≤y2≤0.2, wherein A comprises one or more elements selected from the group consisting of lanthanides and scandium, and wherein B comprises one or more elements selected from the group consisting of Ga and In, wherein in specific embodiments at maximum 10% of Al—O may be replaced by Si—N. As indicated above, in specific embodiments x3 is selected from the range of 0.001-0.04. Especially such luminescent materials may have a suitable spectral distribution (see however below), have a relatively high efficiency, have a relatively high thermal stability, and allow a high CRI (in combination with the first light source light and the second light (and the optical filter)). Hence, in specific embodiments A may be selected from the group consisting of Lu and Gd. Alternatively or additionally, B may comprise Ga. Hence, in embodiments the luminescent material comprises $(Y_{x1-x2-x3}(Lu,Gd)_{x2}Ce_{x3})_3(Al_{y1-y2}Ga_{y2})_5O_{12}$, wherein Lu and/or Gd may be available. Even more especially, x3 is selected from the range of 0.001-0.1, wherein 0<x2+x3≤0.1, and wherein 0≤y2≤0.1. Further, in specific embodiments, at maximum 1% of Al—O may be replaced by Si—N. Here, the percentage refers to moles (as known in the art); see e.g. also EP3149108. In yet further specific embodiments, the luminescent material comprises $(Y_{x1-x2-x3}Ce_{x3})_3Al_5O_{12}$, wherein x1+x3=1, and wherein 0<x3≤0.2, such as 0.001-0.1. In specific embodiments, the light generating device may only include luminescent materials selected from the type of cerium comprising garnets. In even further specific embodiments, the light generating device includes a single type of luminescent materials, such as $(Y_{x1-x2-x3}A_{x2}Ce_{x3})_3(Al_{y1-y2}B_{y2})_5O_{12}$. In specific embodiments, A may especially comprise at least Y, and B may especially comprise at least Al.

In yet further embodiments, in addition to the first luminescent material, the light generating device may also comprise one or more further luminescent materials, especially configured to convert part of one or more of the first light source light and first luminescent material light into further luminescent material light.

Especially, in embodiments the light generating device may also comprise a second luminescent material, especially configured to convert part of one or more of the first light source light and the first luminescent material light into second luminescent material light. Further, especially the second luminescent material light has one or more wavelengths in the range of about 550-700 nm. Further, in specific embodiments the first luminescent material light has a full width half maximum (FWHM) of at least 25 nm, such as at least 40 nm, like in specific embodiments up to about 150 nm (at room temperature). Especially, the second luminescent material light has a color point in the amber and/orange. Especially, in embodiments the second luminescent material light has a dominant wavelength ($\lambda_{d1}$) selected from the spectral wavelength range of 590-605 nm, especially selected from the spectral wavelength range of 590-600 nm. Especially, at least 50% of the spectral power (in Watt) of the first luminescent material light, such as at least 70%, is within the range of 550-650 nm. The second luminescent material light may e.g. have a dominant wavelength in the amber and/or orange wavelength range. Examples of such second luminescent material may e.g. be $M_2Si_5N_8:Eu^{2+}$ and/or $MAlSiN_3:Eu^{2+}$ and/or $Ca_2AlSi_3O_2N_5:Eu^{2+}$, etc., wherein M comprises one or more of Ba, Sr and Ca, especially in embodiments at least Sr. Hence, in embodiments the light generating device may further comprise a second luminescent material configured to convert part of one or more of the first light source light and first luminescent material light into second luminescent material light. Especially, the second luminescent material and the first luminescent material are configured such, that the second luminescent material converts part of the first luminescent material light. Hence, in embodiments the second luminescent material may be configured to convert at least part of the first luminescent material light into second luminescent material light (whereby the first luminescent material light is red-shifted). Hence, in embodiments, second luminescent may comprise one or more materials selected from the group consisting of $(Ba,Sr,Ca)S:Eu$, $(Ba,Sr,Ca)AlSiN_3:Eu$ and $(Ba,Sr,Ca)_2Si_5N_8:Eu$. In these compounds, europium (Eu) is substantially or only divalent, and replaces one or more of the indicated divalent cations. In general, Eu will not be present in amounts larger than 10% of the cation; its presence will especially be in the range of about 0.5 to 10%, more especially in the range of about 0.5 to 5% relative to the cation(s) it replaces. The term ":Eu", indicates that part of the metal ions is replaced by Eu (in these examples by $Eu^{2+}$). For instance, assuming 2% Eu in $CaAlSiN_3:Eu$, the correct formula could be $(Ca_{0.98}Eu_{0.02})AlSiN_3$. Divalent europium will in general replace divalent cations, such as the above divalent alkaline earth cations, especially Ca, Sr or Ba. The material $(Ba,Sr,Ca)S:Eu$ can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Further, the material $(Ba,Sr,Ca)_2Si_5N_8:Eu$ can also be indicated as $M_2Si_5N_8:Eu$, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50 to 100%, more especially 50 to 90% Ba and 50 to 0%, especially 50 to 10% Sr, such as $Ba_{1.5}Sr_{0.5}Si_5N_8:Eu$ (i.e. 75% Ba; 25% Sr). Here, Eu is introduced and replaces at least part of M, i.e. one or more of Ba, Sr, and Ca). Likewise, the material $(Ba,Sr,Ca)AlSiN_3:Eu$ can also be indicated as $MAlSiN_3:Eu$, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Eu in the above indicated luminescent materials is substantially or only in the divalent state, as is known to the person skilled in the art.

By using the second luminescent material, not only amber and/or orange light is added, also part of the blue side of the emission band of the first luminescent material may be absorbed (and thus removed from the spectral power distribution of the first luminescent material light). By converting part of the first luminescent material light, the effective spectral distribution of the first luminescent material light emanating from the lighting device may in embodiments be different from the first luminescent material light generated by the first luminescent material. For instance, when the first luminescent material light has a band shape, part of the first luminescent material light, especially in embodiments having shorter wavelengths, may be absorbed by the second luminescent material. Hence, in embodiments the first luminescent material light emanating from the lighting device may be red-shifted relative to the first luminescent material light generated by the first luminescent material (and thus not in embodiments partly absorbed by the second luminescent material).

In specific embodiments, the second luminescent material may be configured to convert one or more of (i) part of the first luminescent material light and (ii) part of the first light source light into second luminescent material light, especially may be configured to convert (i) part of the first luminescent material light and (ii) part of the first light source light into second luminescent material light. As indicated above, the first luminescent material light emanating from the lighting device may be red-shifted relative to the first luminescent material light generated by the first luminescent material. In specific embodiments the second luminescent material may be configured to convert one or more of (i) part of the first luminescent material light and (ii) part of the first light source light into second luminescent material light having one or more wavelengths in the amber and/or orange spectral wavelength range, especially wherein the second luminescent material light has a dominant wavelength in the spectral wavelength range of 580-610 nm. As indicated above, the second luminescent material light spectral power distribution is different from the first luminescent material light spectral power distribution.

As indicated above, embodiments in relation to the first luminescent material may in general also apply to the second luminescent material. For instance, especially the optical element (see further below) may (also) be configured to combine the (unconverted) first light source light, the second light, the third light source light, and the first luminescent material light, to provide device light.

The lighting device may provide lighting device light during operation. The lighting device light may comprise the first light source light, the first luminescent material light, the second light, and the third light source light. In embodiments, the first light source, the first luminescent material, the second source of second light, and the third light source are chosen such that white device light may be generated. Hence, in specific embodiments the lighting device is configured to generate (in one or more modes of operation) (white) device light comprising the first luminescent material light, the second luminescent material light, and the light source light. Especially, the light generating device is configured to provide in a first operational mode white device light comprising the first light source light, the first luminescent material light, the second light, and the third light source light, with a correlated color temperature selected from the range of 2000-5000 K, such as 2000-4000 K, and a color rendering index selected from the rang of at least 80, like at least 85.

The term "white light" herein, is known to the person skilled in the art. It especially relates to light having a correlated color temperature (CCT) between about 1800 K and 20000 K, such as between 2000 and 20000 K, especially 2700-20000 K, for general lighting especially in the range of about 2700 K and 6500 K. In embodiments, for backlighting purposes the correlated color temperature (CCT) may especially be in the range of about 7000 K and 20000 K. Yet further, in embodiments the correlated color temperature (CCT) is especially within about 15 SDCM (standard deviation of color matching) from the BBL (black body locus), especially within about 10 SDCM from the BBL, even more especially within about 5 SDCM from the BBL. Hence, in specific embodiments the device light has a correlated color temperature selected from the range of 2000-5000 K, such as 2000-4000 K, on or within 10 SDCM from the black body locus.

In specific embodiments, the lighting device may be configured to generate (in one or more operation modes) white lighting device light having a color rendering index selected from the range of at least 80 and having a correlated color temperature selected from the range of 1800-10000 K, like 2000-10000 K, such as at least 2700 K, like at least 3000 K, like up to 8000 K. In specific embodiments, the CRI may be at least 85, even more especially at least 90.

For instance, the device light (escaping from the light generating device) may in embodiments comprise in the range of about 4-30% of the (blue) first light source light, like up to about 25% of the first light source light, like in the range of 4-25%, such as especially in the range of 4-20%, of the first light source light, such as at least about 5%.

Further, for instance the device light (escaping from the light generating device) may in embodiments comprise in the range of 30-75% of the (green/yellow) first luminescent material light, like in the range of 35-70%.

Further, for instance the device light (escaping from the light generating device) may in embodiments comprise in the range of 1-22% of the (amber and/or orange) second light, like in the range of 1-19%, like further in the range of 1-12%, such as at least 2%.

In embodiments in the first operational mode the device light has a device light spectral power and the second luminescent material light has a second luminescent material light spectral power, wherein the second luminescent material light spectral power is especially selected from the range of 1-22% of the total spectral power of the device light spectral power. Alternatively or additionally, in embodiments in the first operational mode the device light has a device light spectral power and the second laser light has a second laser light spectral power, wherein the second laser light spectral power is especially selected from the range of 1-20%, such as 1-18%, of the total spectral power of the device light spectral power. As indicated above, the total contribution of the second light, comprising one or more of second luminescent material light and second laser light may be selected from the range of 1-22%.

Further, for instance the device light (escaping from the light generating device) may in embodiments comprise in the range of 5-45% of the (red) third light source light, like in the range of 7-40%.

When the device light (in one or more (other) operational modes) is not white, the contributions may be different.

Here, the percentage are based on the optical watts. For instance, starting with 1 Watt blue, 10-25% thereof may stay unconverted (and 75-90% may be converted). Due to Stokes losses, 0.75-0.9 Watt of the blue may be converted into about 0.6-0.72 Watt green. Similarly, this applies to the conversion of first luminescent material light into second luminescent material light.

Further, in specific embodiments the light generating device may comprise a control system configured to control one or more of the light sources. In specific embodiments, the control system is configured to control one or more optical properties of the device light, especially in further embodiments in dependence of a user interface, a sensor signal, and a timer. In specific embodiments, the one or more optical properties include the correlated color temperature and the color rendering index.

The system, or apparatus, or device may execute an action in a "mode" or "operation mode" or "mode of operation" or "operational mode". Likewise, in a method an action or stage, or step may be executed in a "mode" or "operation mode" or "mode of operation". The term "mode" may also be indicated as "controlling mode". This does not exclude that the system, or apparatus, or device may also be adapted for providing another controlling mode, or a plurality of other controlling modes. Likewise, this may not exclude that before executing the mode and/or after executing the mode one or more other modes may be executed. However, in embodiments a control system may be available, that is adapted to provide at least the controlling mode. Would other modes be available, the choice of such modes may especially be executed via a user interface, though other options, like executing a mode in dependence of a sensor signal or a (time) scheme, may also be possible. The operation mode may in embodiments also refer to a system, or apparatus, or device, that can only operate in a single operation mode (i.e. "on", without further tunability). Hence, in embodiments, the control system may control in dependence of one or more of an input signal of a user interface, a sensor signal (of a sensor), and a timer. The term "timer" may refer to a clock and/or a predetermined time scheme. See further also below. Especially, there may be a plurality of modes of operation, such as at least two, like at least three, such as at least five, like at least 8, such as at least 16. A change between the modes of operation may be stepwise or stepless. Control can be analogical or digital. The term "controlling" and similar terms especially refer at least to determining the behavior or supervising the running of an element. Hence, herein "controlling" and similar terms may e.g. refer to imposing behavior to the element (determining the behavior or supervising the running of an element), etc., such as e.g. measuring, displaying, actuating, opening, shifting, changing temperature, etc . . . . Beyond that, the term "controlling" and similar terms may additionally include monitoring. Hence, the term "controlling" and similar terms may include imposing behavior on an element and also imposing behavior on an element and monitoring the element. The controlling of the element can be done with a control system, which may also be indicated as "controller". The control system and the element may thus at least temporarily, or permanently, functionally be coupled. The element may comprise the control system. In embodiments, the control system and element may not be physically coupled. Control can be done via wired and/or wireless control. The term "control system" may also refer to a plurality of different control systems, which especially are functionally coupled, and of which e.g. one control system may be a master control system and one or more others may be slave control systems. A control system may comprise or may be functionally coupled to a user interface. The control system may also be configured to receive and execute instructions form a remote control. In embodiments, the control system may be controlled via an App on a device, such as a portable device, like a Smartphone or I-phone, a tablet, etc . . . . The device is thus not necessarily coupled to the lighting system, but may be (temporarily) functionally coupled to the lighting system. Hence, in embodiments the control system may (also) be configured to be controlled by an App on a remote device. In such embodiments the control system of the lighting system may be a slave control system or control in a slave mode. For instance, the lighting system may be identifiable with a code, especially a unique code for the respective lighting system. The control system of the lighting system may be configured to be controlled by an external control system which has access to the lighting system on the basis of knowledge (input by a user interface of with an optical sensor (e.g. QR code reader) of the (unique) code. The lighting system may also comprise means for communicating with other systems or devices, such as on the basis of Bluetooth, LiFi, WIFI, ZigBee, BLE or WiMAX, or another wireless technology.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage. The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

In specific embodiments, the light generating device may be comprise a control system configured to control the first light source, the third light source, and the optional second laser light source. This may allow controlling the correlated color temperature and/or the color rendering index, and/or the color point of the device light. Hence, in specific embodiments the light generating device may further comprise a control system, wherein the control system is configured to control one or more of the correlated color temperature and the color rendering index of the device light by controlling the first light source, the third light source, and optionally the second laser light source (when available). In even more specific embodiments the control system is configured to keep in a controlling mode the color rendering index over 85, even more especially at least 90, and the correlated color temperature within the range of 2300-3500 K, especially in the range of 2500-3500 K.

It may be desirable to (further) shape the device light into a beam of device light. Alternatively or additionally, it may be desirable to (further) homogenize the device light (into homogenized device light). To this end, an optical element may be used. Hence, in embodiments the light generating device may further comprise an optical element configured to beam shape the device light and/or configured to homogenize the device light. Especially, the optical element is configured downstream of the first luminescent material. Further, the optical element is configured downstream from one or more first light source and downstream of the second source of second light. The optical element may especially comprise a collimator used to convert (to "collimate") the light beam into a beam having a desired angular distribution. Further, the optical element especially comprises a light transmissive body comprising the radiation entrance window. Hence, the optical element may be a body of light transmissive material that is configured to collimate the converter radiation from the luminescent body. In specific embodiments, the optical element comprises a compound parabolic like collimator, such as a CPC (compound parabolic concentrator). A massive collimator, such as a massive CPC, may especially be used as extractor of light and to collimate the (emission) radiation. Alternatively, one may also comprise a dome with optical contact (n>1.00) on the nose of the rod or a hollow collimator, such as a CPC, to concentrate the (emission) radiation.

The optical element may have cross section (perpendicular to an optical axis) with a shape that is the same as the cross-section of the luminescent body (perpendicular to the longest body axis (which body axis is especially parallel to a radiation input face) (see further also below). For instance, would the latter have a rectangular cross section, the former may also have such rectangular cross section, though the dimension may be different. Further, the dimension of the optical element may vary over its length (as it may have a beam shaping function).

Further, the shape of the cross-section of the optical element may vary with position along the optical axis. In a specific configuration, the aspect ratio of a rectangular cross-section may change, preferably monotonically, with position along the optical axis. In another preferred configuration, the shape of the cross-section of the optical element may change from round to rectangular, or vice versa, with position along the optical axis.

Especially, the optical element may (then) be configured to combine two or more of (i) (unconverted) first light source light, (ii) the second light, (iii) the third light source light, and (iv) the first luminescent material light. In specific embodiments, the optical element may be configured to combine (i) the (unconverted) first light source light, (ii) the second light, (iii) the third light source light, and (iv) the first luminescent material light to provide device light. Hence, in embodiments the light generating device comprises an optical element configured to combine unconverted first light source light, the second light, the third light source light, and the first luminescent material light, to provide device light. In further specific embodiments, the optical element may be configured to combine (i) the (unconverted) first light source light, (ii) the second laser light, (iii) the third light source light, and (iv) the first luminescent material light to provide device light. Alternatively or additionally, in further specific embodiments, the optical element may be configured to combine (i) the (unconverted) first light source light, (ii) the second luminescent material light, (iii) the third light source light, and (iv) the first luminescent material light to provide device light.

Note that the optical element may also be configured to combine two or more of these indicated lights. During operation of the light generating device, it is not necessary that all types of light are available. This may depend e.g. on the mode of operation, such as whether or not white light or whether or not colored light is provided, or it may depend upon the correlated color temperature.

In specific embodiments, the optical element may comprise one or more of (i) a dichroic beam combiner and (ii) an optical homogenizer. The dichroic beam combiner may in embodiments comprise a dichroic prism. A dichroic beam combiner may also be used to transmit a first type of light and to reflect a second type of light wherein tan optical axis of the transmitted first type of light and an optical axis of the second type of light may substantially coincide downstream of the dichroic beam combiner. Embodiments of a homogenizer are also indicated above. In embodiments, two or more dichroic beam combiners may be applied, for instance to introduce into the beam two or more of the second light, especially the second laser light, the third light source light and the fourth light source light. Hence, especially the dichroic beam combiner is configured downstream of the (first and/or second) luminescent material. However, in other embodiments, one or more dichroic beam combiners may be configured upstream of the (first and/or second) luminescent material and/or one or more dichroic beam combiners may be configured downstream of the (first and/or second) luminescent material.

The term "optical element" may also refer to a plurality of (different) optical elements.

In specific embodiments, all first light source light that is comprised by the device light is one or more of (i) reflected, (ii) scattered, and (iii) transmitted by the first luminescent material. With respect to the second light, especially the second laser light, the second light, especially the second laser light, may in embodiments (also) be one or more of (i) reflected, (ii) scattered, and (iii) transmitted by the first luminescent material (see further also below). However, in (other) embodiments the second light, especially the second laser light, (also) does not have essentially any interaction with the first luminescent material, as it may be added to the first luminescent material light, i.e. downstream of the first luminescent material. Hence, in specific embodiments the second source of second light, especially the second laser light source, may be configured downstream of the first luminescent material, and the light generating device is configured to combine the second light, especially the second laser light, and the first luminescent material light (downstream of the first luminescent material). To this end, also (optional) (second) optics may be applied, like a dichroic mirror (dichroic beam combiner). With respect to the third light source, the third light source light may in embodiments (also) be one or more of (i) reflected, (ii) scattered, and (iii) transmitted by the first luminescent material (see further also below). However, in (other) embodiments the third light source light (also) does not have essentially any interaction with the first luminescent material, as it may be added to the first luminescent material light, i.e. downstream of the first luminescent material. Hence, in specific embodiments the third light source is configured downstream of the first luminescent material, and the light generating device is configured to combine the third light source light and the first luminescent material light (downstream of the first luminescent material). To this end, also (optional) optics may be applied, like a dichroic mirror (dichroic beam combiner).

In specific embodiments, the first light source, the first luminescent material, and the second luminescent material may be configured such that at least part of the first light source light can only reach the second luminescent material after one or more of (i) scattering by the first luminescent material, (ii) reflection by the first luminescent material, and (iii) transmission through the first luminescent material. Hence, the first light source light, and/or the second light (especially the second laser light source light), and/or third light source light may in embodiments be one or more of (i) reflected, (ii) scattered, and (iii) transmitted by the first luminescent material. For instance, in embodiments the first luminescent material may be transmissive for at least part of the first light source light and/or at least part of the second light and/or at least part of third light source light.

The term "second laser light source light" and similar terms especially indicate the light generated by a second laser light source.

Especially, in embodiments the first luminescent material is transmissive for at least part of the second light.

In embodiments, the first luminescent material may be comprised or be configured as a light transmissive body, such as in specific embodiments a light transparent body. In such embodiments, the second source of light, especially the second laser light source, and/or third light source and/or the first light source may be configured upstream of the first luminescent material. Therefore, in specific embodiments the first luminescent material may be transmissive for at least part of the second light, especially the second laser light, and/or at least part of third light source light and/or at least part of the first light source light, wherein the second source of light, especially the second laser light source, and/or third light source and/or the first light source are configured upstream of the first luminescent material, and wherein during the one or more operational modes at least part of the second light, especially the second laser light, and/or third light source light and/or the first light source light is transmitted through the first luminescent material to provide transmitted second light and/or third light source light and/or the first light source light. Yet further, especially in the one or more operational modes of the light generating device the light generating device is configured to generate (white) device light comprising the first luminescent material light, and the transmitted second light and/or transmitted third light source light and/or transmitted the first light source light. However, one or more of the second source of light, especially the second laser light source, and the third light source may also be configured downstream of the first luminescent material. In this way the light of the one or more of the second source of light, especially the second laser light source, and the third light source may bypass the first luminescent material. Having the first luminescent material transmit, scatter, or reflect may add to homogenization of the device light. In specific embodiments, at least part of the second light may be transmitted by the first luminescent material. Further, in embodiments at least part of the third light source light may bypass the first luminescent materials. Hence, in embodiments the second source of light, especially the second laser light source, may be configured upstream of the first luminescent material, and the third light source (however) may be configured to generate the third light source light that bypasses the first luminescent material.

Further, in embodiments (at least) part of the first light source light may bypass the first luminescent material. Hence, the first light source may be configured to generate the first light source light that bypasses the first luminescent material and first light source light that does not bypass the first luminescent material. Hence, there may be a plurality of first light sources, of which a subset is configured upstream of the first luminescent material (which at least partly converts that first light source light) and of which a subset may be configured to generate first light source light that bypasses the first luminescent material (and which is thus not converted, reflected, absorbed, or scattered by the first luminescent material).

Alternatively or additionally, in embodiments at least part of the first light source light may bypass the second luminescent material. Hence, the first light source may be configured to generate the first light source light that bypasses the second luminescent material and first light source light that does not bypass the second luminescent material. Hence, there may be a plurality of first light sources, of which a subset is configured upstream of the second luminescent material and of which a subset may be configured to generate first light source light that bypasses the second luminescent material.

In specific embodiments, the third light source may be configured upstream of the first luminescent material and of the second luminescent material, wherein the first luminescent material is transmissive for at least part of the third light source light and wherein the second luminescent material is transmissive for at least part of the third light source light. In alternative embodiments, the third light source may be configured downstream of the first luminescent material and of the second luminescent material, wherein the third light source is configured to generate the third light source light that bypasses the first luminescent material and the second luminescent material. Yet further, in specific embodiments the second laser light source is configured downstream of the first luminescent material and of the second luminescent material, wherein the second laser light source is configured to generate the second laser light source light that bypasses the first luminescent material and the second luminescent material.

Especially, the first light source light has an optical axis. In specific embodiments, the optical axis (O) is incident on the first converter material and is not incident on the second converter material. In this way, the second converter material, especially the second luminescent material, may be protected from direct first (laser) light source light. Embodiments wherein the optical axis (O) is incident on the first converter material and is not incident on the second converter material may especially be obtained when first light source light can only reach the second converter material by scattering via the first converter material (or cannot reach the second converter material at all in specific embodiments).

Especially, in embodiments the light generating device may comprise a luminescent body, wherein the luminescent body comprises the first luminescent material. In such embodiments, it may also be possible to pump with a plurality of first light sources the luminescent body. This may further increase the output of the light generating device. Hence, in yet further specific embodiments the light generating device may comprise a plurality of first light sources, wherein the plurality of first light sources are configured to irradiate the luminescent body with the first light source light. Instead of the term "luminescent body", and similar terms, also the term "light transmissive body", and similar terms, may be applied, as the luminescent body is also transmissive for the first luminescent material light.

As indicated above, the light generating system especially comprises in embodiments a luminescent body. The luminescent body may comprise (N) side faces (over at least part of the length L), wherein N≥3. Hence, especially the luminescent body has a cross-sectional shape that is square (N=4), rectangular (N=4), hexagonal (n=6), or octagonal (n=8), especially rectangular. Would the luminescent body have a circular cross-section, N may be considered ∞.

The (elongated) body includes a first end or first face, in general configured perpendicular to one or more of the (n) side faces and a second end or second face, which may be configured perpendicular to one or more of the side faces, and thus parallel to the first face, but which also may be configured under an angle unequal to 90° and unequal to 180°. Hence, in embodiments in specific embodiments the radiation exit window has an angle unequal to 0° and unequal to 180° with one or more of the one or more side faces, especially all of the side faces. Note that the angle α may differ per for different side faces. For instance, a slanted radiation exit window of a bar shaped elongated body may have an angle of α1 with a first side face, an angle α2=180°−α1 with a second side face, and angles of 90° with the two other side faces. The (elongated) luminescent body may thus in embodiments include (n) side faces, which comprise a first side face, comprising a radiation input face, and a second side face configured parallel to the first side face, wherein the side faces define a height (H). The first and the second side face are configured parallel with luminescent body material in between, thereby defining the width of the luminescent body. The radiation input face is at least part of the first face which may be configured to receive the light source light. The (elongated) luminescent body further comprises a radiation exit window bridging at least part of the height (H) between the first side face and the second side face. Especially, the radiation exit window is comprised by the second face. Further embodiments are also elucidated below. As indicated above, in embodiments the radiation exit window and the radiation input face have an angle (a) unequal to 0° and unequal to 180°. Yet further, as also indicated above in embodiments the radiation exit window has an angle unequal to 0° and unequal to 180° with one or more of the one or more side faces.

The light transmissive body has light guiding or wave guiding properties. Hence, the light transmissive body is herein also indicated as waveguide or light guide. As the light transmissive body is used as light concentrator, the light transmissive body is herein also indicated as light concentrator. The light transmissive body will in general have (some) transmission of one or more of (N)UV, visible and (N)IR radiation, such as in embodiments at least visible light, in a direction perpendicular to the length of the light transmissive body. Without the activator (dopant) such as trivalent cerium, the internal transmission in the visible might be close to 100%.

The transmission of the light transmissive body for one or more (first) luminescence wavelengths may be at least 80%/cm, such as at least 90%/cm, even more especially at least 95%/cm, such as at least 98%/cm, such as at least 99%/cm. This implies that e.g. a 1 $cm^3$ cubic shaped piece of light transmissive body, under perpendicular irradiation of radiation having a selected luminescence wavelength (such as a wavelength corresponding to an emission maximum of the luminescence of the luminescent material of the light transmissive body), will have a transmission of at least 95%. Hence, the luminescent body is herein also indicated "light transmissive body", as this body is light transmissive for the luminescent material light. Herein, values for transmission especially refer to transmission without taking into account Fresnel losses at interfaces (with e.g. air). Hence, the term "transmission" especially refers to the internal transmission. The internal transmission may e.g. be determined by measuring the transmission of two or more bodies having a different width over which the transmission is measured. Then, based on such measurements the contribution of Fresnel reflection losses and (consequently) the internal transmission can be determined. Hence, especially, the values for transmission indicated herein, disregard Fresnel losses. In embodiments, an anti-reflection coating may be applied to the luminescent body, such as to suppress Fresnel reflection losses (during the light incoupling process). In addition to a high transmission for the wavelength(s) of interest, also the scattering for the wavelength(s) may especially be low. Hence, the mean free path for the wavelength of interest only taking into account scattering effects (thus not taking into account possible absorption (which should be low anyhow in view of the high transmission), may be at least 0.5 times the length of the body, such as at least the length of the body, like at least twice the length of the body. For instance, in embodiments the mean free path only taking into account scattering effects may be at least 5 mm, such as at least 10 mm. The wavelength of interest may especially be the wavelength at maximum emission of the luminescence of the luminescent material. The term "mean free path" is especially the average distance a ray will travel before experiencing a scattering event that will change its propagation direction. The transmission can be determined by providing light at a specific wavelength with a first intensity to the light transmissive body under perpendicular radiation and relating the intensity of the light at that wavelength measured after transmission through the material, to the first intensity of the light provided at that specific wavelength to the material (see also E-208 and E-406 of the CRC Handbook of Chemistry and Physics, 69th edition, 1088-1989).

The terms "light" and "radiation" are herein interchangeably used, unless clear from the context that the term "light" only refers to visible light. The terms "light" and "radiation" may thus refer to UV radiation, visible light, and IR radiation. In specific embodiments, especially for lighting applications, the terms "light" and "radiation" refer to visible light.

The light transmissive body may have any shape, such as beam (or bar) like or rod like, however especially beam like (cuboid like). The light transmissive body, such as the luminescent concentrator, might be hollow, like a tube, or might be filled with another material, like a tube filled with water or a tube filled with another solid light transmissive medium. The invention is not limited to specific embodiments of shapes, neither is the invention limited to embodiments with a single exit window or outcoupling face. Below, some specific embodiments are described in more detail. Would the light transmissive body have a circular cross-section, then the width and height may be equal (and may be defined as diameter). Especially, however, the light transmissive body has a cuboid like shape, such as a bar like shape, and is further configured to provide a single exit window.

In embodiments, one or more of the light source may be configured in a reflective configuration with the luminescent material. Further, in embodiments one or more of the light sources may be configured in a transmissive configuration.

Especially, in embodiments the solid state light source, or other light source, is not in (direct) physical contact with the light transmissive body.

Especially, in embodiments the light transmissive body comprises a radiation input face, configured in a light receiving relationship with the first light source, and a radiation exit face. Especially, in embodiments the radiation input face and the radiation exit face are not the same part of the light transmissive body, though it is not excluded that the same face may be used for providing the radiation input face and the radiation exit face. In specific embodiments, the radiation exit face and the radiation input face are comprises by different faces of the light transmissive body (see further also below).

Hence, the light transmissive body, more especially the radiation input face thereof, is configured downstream of the first light source. Or, in other words, the light transmissive body, more especially the radiation input face thereof, is radiationally coupled with the first light source.

The terms "radiationally coupled" or "optically coupled" may especially mean that (i) a light generating element, such as a light source, and (ii) another item or material, are associated with each other so that at least part of the radiation emitted by the light transmissive body is received by the item or material. In other words, the item or material is configured in a light-receiving relationship with the light transmissive body. At least part of the radiation of light transmissive body will be received by the item or material. This may in embodiments be directly, such as the item or material in physical contact with the (light emitting surface of the) light transmissive body. This may in embodiments be via a medium, like air, a gas, or a liquid or solid light guiding material. In embodiments, also one or more optics, like a lens, a reflector, an optical filter, may be configured in the optical path between light transmissive body and item or material.

The terms "upstream" and "downstream" relate to an arrangement of items or features relative to the propagation of the light from a light generating means (here the especially the light source), wherein relative to a first position within a beam of light from the light generating means, a second position in the beam of light closer to the light generating means is "upstream", and a third position within the beam of light further away from the light generating means is "downstream".

Hence, the light transmissive body is especially transmissive for at least part of the light source light propagating from the radiation input face to the radiation exit face. Further, the light transmissive body is especially further configured to convert part of the light source light propagating through the light transmissive body into first luminescent material light. Light transmissive body are known in the art, such as e.g. described in WO2006/054203, which is incorporated herein by reference.

As indicated above, the light transmissive body is especially configured to convert part of the (first) light source light propagating through the light transmissive body into first luminescent material light having a first luminescent material light spectral power distribution differing from the first spectral power distribution of the first light source light. The first luminescent material light may especially be due to down conversion, see also above.

In a specific embodiment, the light transmissive body may especially have an aspect ratio larger than 1, i.e. the length is larger than the width. In general, the light transmissive body is a rod, or bar (beam), or a rectangular plate, though the light transmissive body does not necessarily have a square, rectangular or round cross-section. In general, the light source is configured to irradiate one (or more) of the longer faces (side edge), herein indicated as radiation input face, and radiation escapes from a face at a front (front edge), herein indicated as radiation exit window. The light source(s) may provide radiation to one or more side faces, and optionally an end face. Hence, there may be more than one radiation input face. The generally rod shaped or bar shaped light transmissive body can have any cross-sectional shape, but in embodiments has a cross section the shape of a square, rectangle, round, oval, triangle, pentagon, or hexagon. The radiation exit window may especially have an angle unequal to 0° and unequal to 180° with the radiation input face, such as angle(s) of 90°. Further, in specific embodiments the radiation exit window has an angle unequal to 0° and unequal to 180° with one or more of the one or more side faces, such as angle(s) of 90°. Generally, the (ceramic or crystal) bodies are cuboid. In specific embodiments, the body may be provided with a different shape than a cuboid, with the light input surface having somewhat the shape of a trapezoid. By doing so, the light flux may be even enhanced, which may be advantageous for some applications. Hence, in some instances (see also above) the term "width" may also refer to diameter, such as in the case of a light transmissive body having a round cross section.

In (other) embodiments, the body further has a lateral dimensions width or length (W or L) or diameter (D) and a thickness or height (H). In embodiments, (i) D≥H or (ii) and W≥H and/or L≥H. The luminescent tile may be transparent or light scattering. In embodiments, the tile may comprise a ceramic luminescent material. In specific embodiments, L≤10 mm, such as especially L≤5 mm, more especially L≤3 mm, most especially L≤2 mm. In specific embodiments, W≤10 mm, such as especially W≤5 mm, more especially W≤3 mm, most especially W≤2 mm. In specific embodiments, H≤10 mm, such as especially H≤5 mm, more especially H≤3 mm, most especially H≤2 mm. In specific embodiments, D≤10 mm, such as especially D≤5 mm, more especially D≤3 mm, most especially D≤2 mm. In specific embodiments, the body may have in embodiments a thickness in the range 50 μm-1 mm. Further, the body may have lateral dimensions (width/diameter) in the range 100 μm-10 mm. In yet further specific embodiments, (i) D>H or (ii) W>H and W>H. Especially, the lateral dimensions like length, width, and diameter are at least 2 times, like at least 5 times, larger than the height.

In embodiments, the luminescent material is comprised by or provided as a (light transmissive) body. In embodiment, the luminescent material is comprised by or provided as (light transmissive) layer. The layer may in embodiments also be indicated as body. In specific embodiments, the light generating device comprises a luminescent body, wherein the luminescent body comprises the first luminescent material, and wherein the luminescent body is a ceramic body. Likewise, this may apply to the second luminescent material. In specific embodiments, the body may comprise both the first luminescent material and the second luminescent material. Hence, in embodiments the luminescent body comprises the second luminescent material. Hence, in specific embodiment a ceramic body comprises the first luminescent material and the second luminescent material.

In embodiments, the (first) luminescent is comprised by a single crystal. In (other) embodiments, the (first) luminescent is comprised by a ceramic body. In yet other embodiments, the (first) luminescent is comprised by a polycrystalline material, such as a polycrystalline material layer. This may in embodiments be a powder layer or a compacted powder layer. In specific embodiments, a powder layer or a compacted powder layer may comprise both the first luminescent material and the second luminescent material. Hence, in embodiments a powder layer or a compacted powder layer comprises the second luminescent material. In yet other embodiments, a multi-layer may be applied, wherein a first layer comprises the first luminescent material (and essentially no second luminescent material) and a second layer comprises the second luminescent material (and essentially not the first luminescent material). Herein, "essentially not" may indicate a weight ratio of <0.1, such as <0.01. Therefore, in yet further specific embodiments the luminescent body may comprises one or more of a ceramic body and a multi-layer material. The multi-layer material may thus comprise the first luminescent material and the second luminescent material, and may in specific embodiments also be a ceramic body.

Light source light of one or more of the light sources may be provided to the first luminescent material in a transmissive configuration or a reflective configuration. When more than one light source is configured to provide light source light to the first luminescent material, the light source light of the two or more of the light sources may be provided to the first luminescent material in a transmissive configuration and a reflective configuration.

In embodiments, a dichroic filter may be configured between the first light source and the first luminescent material, i.e. downstream of the first light source and upstream of the first luminescent material. Alternatively or additionally, a dichroic filter may be configured between the second source of light, especially the second laser light source, and the first luminescent material, i.e. downstream of the second source of light, especially the second laser light source, and upstream of the first luminescent material. Alternatively or additionally, a dichroic filter may be configured between the third light source and the first luminescent material, i.e. downstream of the third light source and upstream of the first luminescent material. A dichroic filter may be applied to allow the light source light be transmitted by the dichroic filter and the first luminescent material light to be reflected back. In this way, first luminescent material light propagating in the direction of the first light source and/or the second source of light, especially the second laser light source, may at least partly be reused. Hence, in an embodiment a dichroic filter may be configured between the first luminescent material and the optical element.

The dichroic filter and first luminescent material may have a non-zero distance, such as e.g. selected from the range of 0.01-10 mm. Without physical contact, especially at a distance of at least about 0.001 mm, there may be less light loss.

When there is no dichroic filter (or other optics), in embodiments the first light source and/or the second laser light source may have a non-zero distance to the first luminescent material, such as e.g. selected from the range of 0.01-10 mm. Without physical contact, especially at a distance of at least about 0.001 mm, there may be less light loss. A non-zero distance may also allow different thermal pathways for the first light source and/or second laser light source and the first luminescent material.

One or more heat sinks may be configured in thermal contact with one or more of the first light source, the second source of second light, the third light source, the fourth light source, and the first luminescent material.

In embodiments, in an operational mode of the light generating device, the light generating device is configured to generate white device light having a CRI of at least 70, a correlated color temperature selected from the range of 2500-7000 K, such as 2500-6500 K. As indicated above, the control system may be configured to control the correlated color temperature by controlling the second laser light source. In yet further embodiments, the control system is configured to control the first light source, the second laser light source, the third light source and the fourth light source. Especially, the control system may be configured to keep in a controlling mode the color rendering index over 75 and the correlated color temperature within the range of 2500-6500 K, such as 2700-6500 K. A user may select a CRI value and/or a CCT value, and the control system may define the spectral power distribution of the device light. Especially, however, the CRI is at least 80 and the correlated color temperature may be selected from the range of 2000-5000 K. The luminous efficiency of the device (light) may in embodiments be selected from the range of 290-370 Lm/W, such as 300-360 Lm/W. In embodiments, the light generating device is configured to provide the luminescent light with power emitted from a radiation exit face of the luminescent body having a power density of 4 W/mm², especially a power density at least 7 W/mm², more especially at least 9 W/mm², even more especially at least 13 W/mm². Hence, in embodiments in an operational mode of the light generating device, the light generating device is configured to generate the luminescent material light from a radiation exit surface (or radiation exit face) of the luminescent converter with a power density of at least 4 W/mm². In yet further specific embodiments, the lighting device may be configured to provide luminescent light in combination with blue and/or red laser light coming out the same surface as the luminescent light providing white light with a brightness of at least 2000 lm/mm², more especially at least 3000 lm/mm², even more especially at least 6000 lm/mm² Herein, "lm" refers to lumen.

In yet a further aspect, the invention also provides a luminaire comprising the light generating device as defined herein. The luminaire may further comprise a housing, optical elements, louvres, etc. etc.

The lighting device (or luminaire) may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, digital projection, or LCD backlighting, etc.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1A:
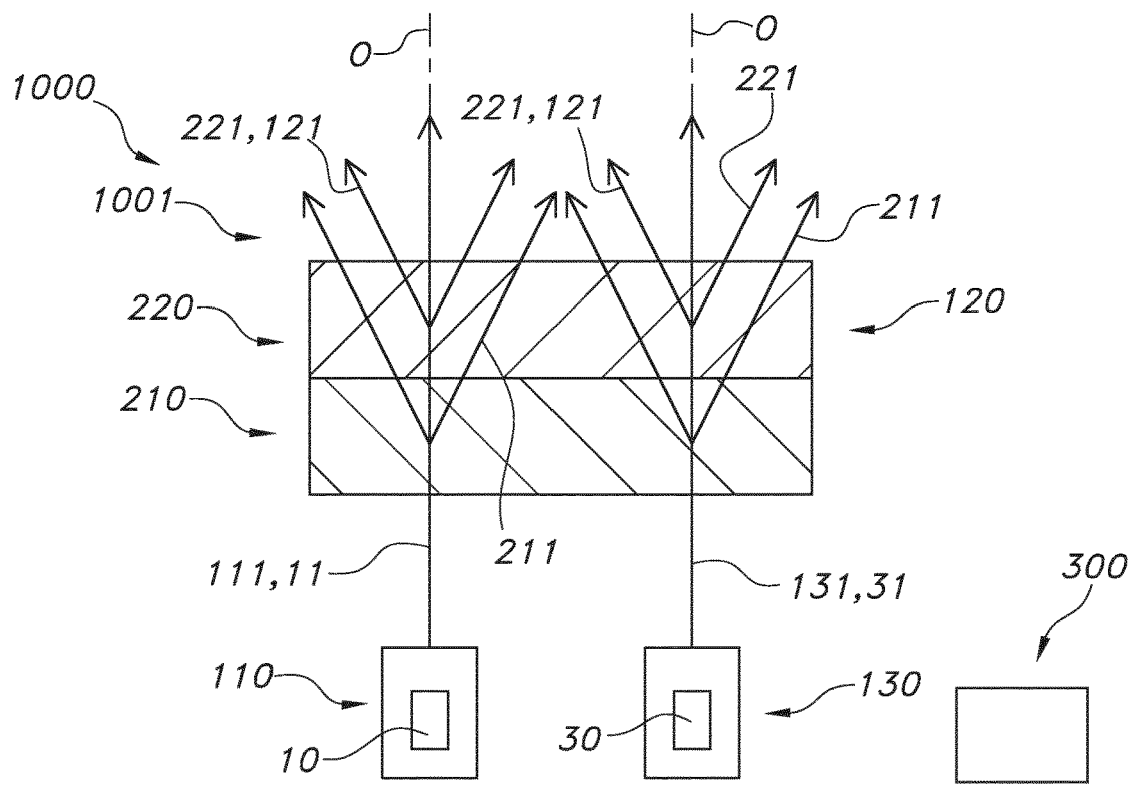
FIGS. 1a-1h schematically depict some aspects and variants.

The schematic drawings are not necessarily to scale.

DETAILED DESCRIPTION OF THE EMBODIMENTS

FIGS. 1a-1h schematically depict embodiments of a light generating device 1000 configured to generate device light 1001. The light generating device 1000 comprises a first light source 110, a first luminescent material 210, a second source 120 of second light 121, and a third light source 130.

The first light source 110 is configured to generate blue first light source light 111 having a first peak wavelength $\lambda_1$, e.g. selected from the spectral wavelength range of 440-475 nm. Especially, the first light source 110 is a first laser light source 10. The first laser light source is configured to generate first laser light source light 11.

The first luminescent material 210 is configured to convert at least part of the first light source light 111 into first luminescent material light 211 having an emission band having wavelengths in one or more of the green spectral wavelength range and the yellow spectral wavelength range. In embodiments, the first luminescent material 210 may comprise a luminescent material of the type $A_3B_5O_{12}$:Ce, wherein A comprises one or more of Y, Gd, Tb and Lu, and wherein B comprises one or more of Al, Ga, and In, wherein A comprises at least Y, and wherein B comprises at least Al.

The second source 120 of second light 121 is configured to provide the second light 121 having an emission band having in embodiments a dominant wavelength or peak wavelength in the spectral wavelength range of 580-610 nm.

In embodiments, the second source 120 of second light 121 comprises a second laser light source 20 configured to generate second laser light source light 21. Especially, in embodiments the second laser light source light 21 has a second peak wavelength $\lambda_2$ selected from the spectral wavelength range of 590-600 nm. Such embodiments are schematically depicted in FIGS. 1c and 1d.

Alternatively or additionally, in embodiments the second source 120 of second light 121 comprises a second luminescent material 220 configured to convert one or more of the first light source light 111 and the first luminescent material light 211 into second luminescent material light 221. Especially, the second luminescent material light 221 has a dominant wavelength in the spectral wavelength range of 580-610 nm. Such embodiments are schematically depicted in FIGS. 1a, 1b, 1e, 1f, 1g, and 1h.

Especially, the third light source 130 is configured to generate red third light source light 131 having a third peak wavelength $\lambda_3$, in specific embodiments selected from the spectral wavelength range of 630-670 nm. Especially, the third light source 130 is a third laser light source 30. The third laser light source 30 is configured to generate third laser light source light 31.

Further, in embodiments the light generating device 1000 is configured to provide in a first operational mode white device light 1001 comprising the first light source light 111, the first luminescent material light 211, the second light 121, and the third light source light 131, especially with a correlated color temperature selected from the range of 2000-5000 K, such as 2000-4000 K, and a color rendering index selected from the rang of at least 80.

In specific embodiments, $\lambda_1$ is selected from the spectral wavelength range of 450-470 nm, and wherein $\lambda_3$ is selected from the spectral wavelength range of 635-650 nm.

Figure 1B:
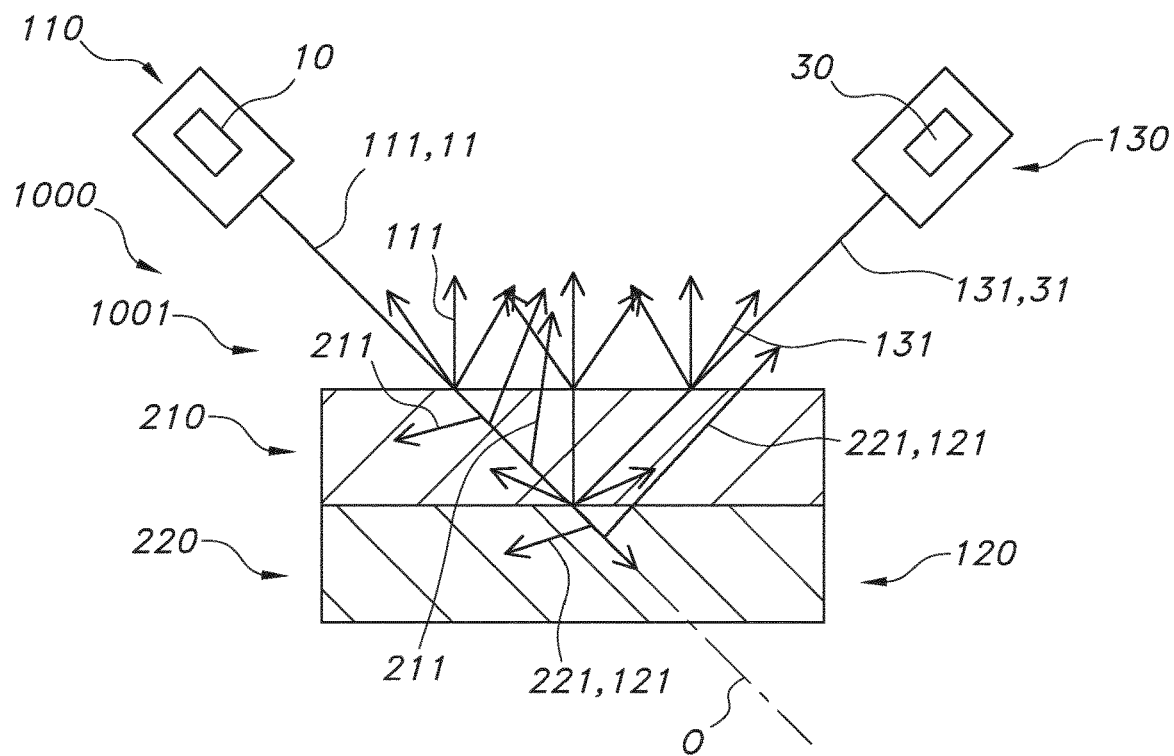
Figure 1C:
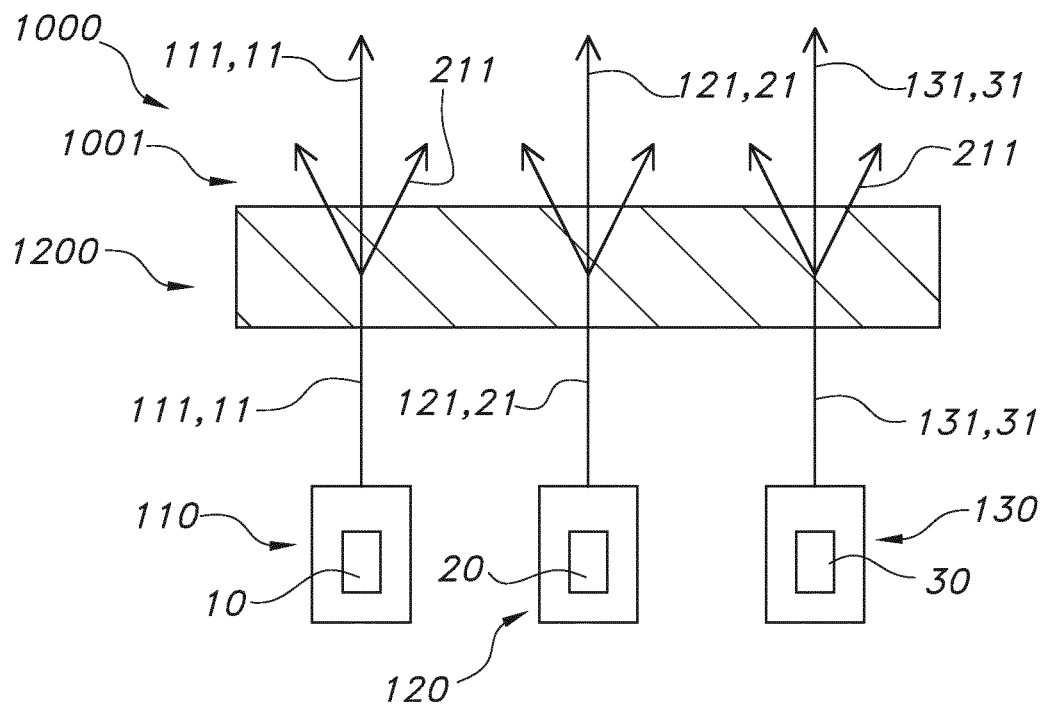
Figure 1D:
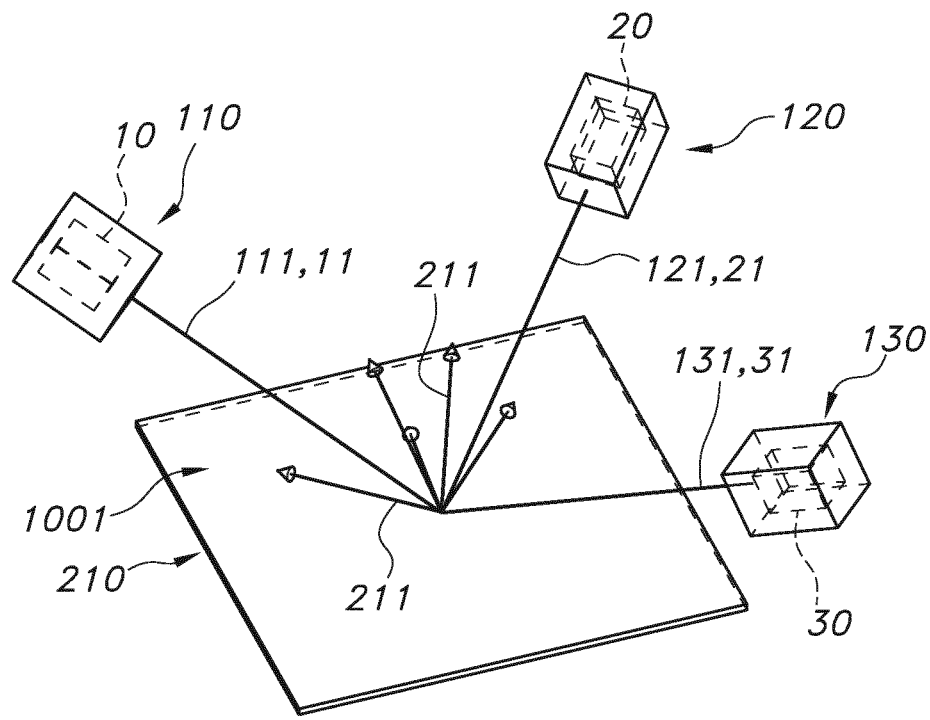
Figure 1E:
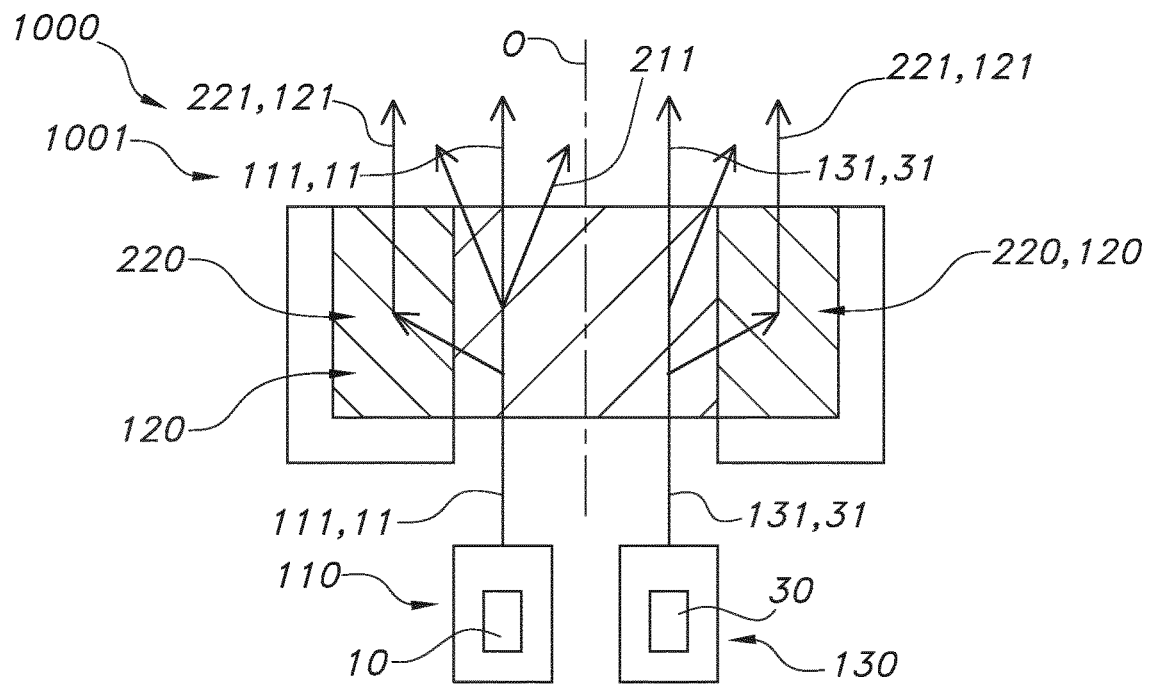

FIGS. 1a, 1b, and 1e schematically depict embodiments wherein the first light source 110, the first luminescent material 210, and the second luminescent material 220 are configured such that at least part of the first light source light 111 can only reach the second luminescent material 220 after one or more of scattering by the first luminescent material 210, reflection by the first luminescent material 210, and transmission through the first luminescent material 210.

By way of example, FIG. 1a also includes a control system 300. Such control system may or may not be available. Also in the other schematically depicted embodiments such control system 300 may or may not be available (see further also FIG. 4).

Reference O indicates an optical axis (of a light source).

FIG. 1e schematically depicts an embodiment wherein the first light source light 111 has an optical axis O, wherein the optical axis O is incident on the first luminescent material 210 and is not incident on the second luminescent material 220 (unlike e.g. the embodiment of FIG. 1a). Hence, essentially the second luminescent material 220 may only be excited by the first light source light 211 (and optionally e.g. some scattered first light source light 111). Hence, in embodiments as schematically depicted in 1e, but optionally also in FIGS. 1a, 1b, and 1h.

In FIG. 1c, all light sources, including the second laser light source 20, provide the radiation to a surface of the first luminescent material 210.

Figure 1F:
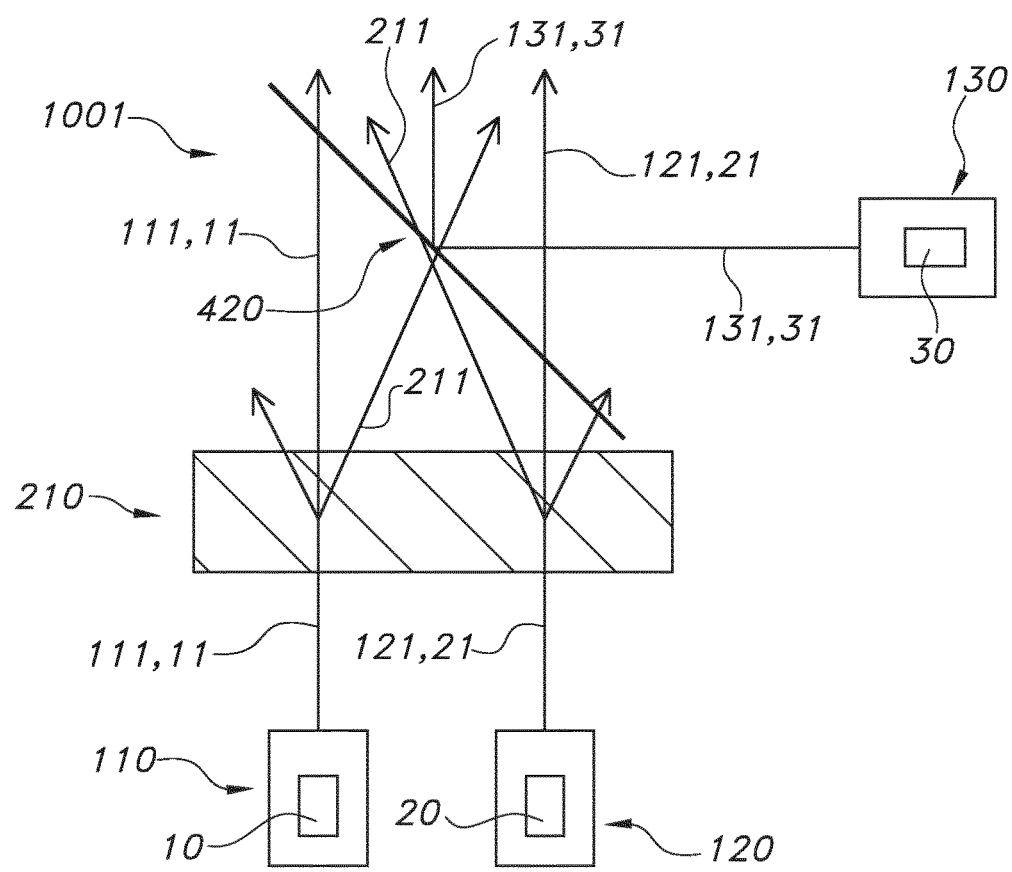
Figure 1G:
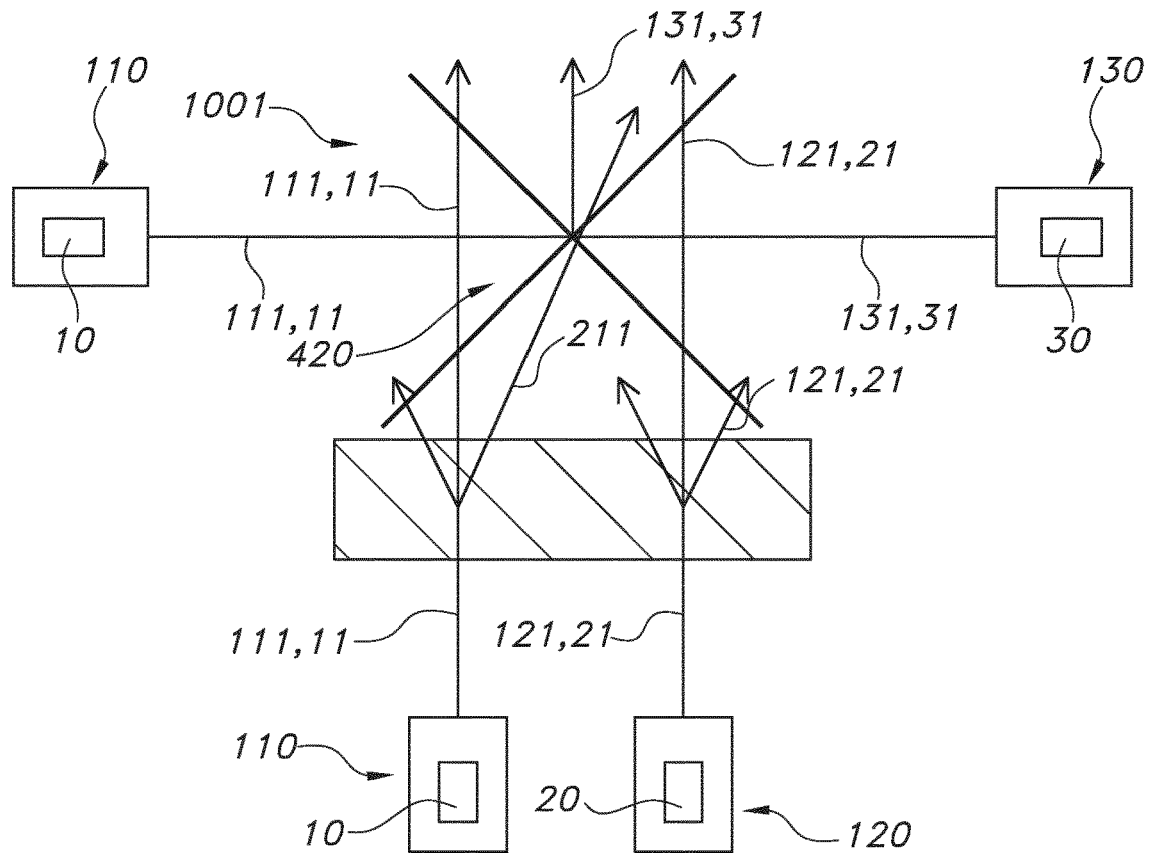

In the embodiment schematically depicted in FIG. 1f, a combiner, such as dichroic mirror, is applied to introduce the third light source light 131 into the beam comprising first light source light 111, second light 21, and first luminescent material light 211. In specific embodiments, the light generating device 1000 may further comprise an optical element 420 configured to combine the first light source light 111, the first luminescent material light 211, the second light 121, and the third light source light 131.

Referring by way of example to FIG. 1c, the light generating device (1000) may comprise a luminescent body (1200), wherein the luminescent body (1200) comprises the first luminescent material (210). In embodiments, the luminescent body (1200) may comprise one or more of a ceramic body and a multi-layer material. A ceramic body may be a multi-layer ceramic body.

Figure 1H:
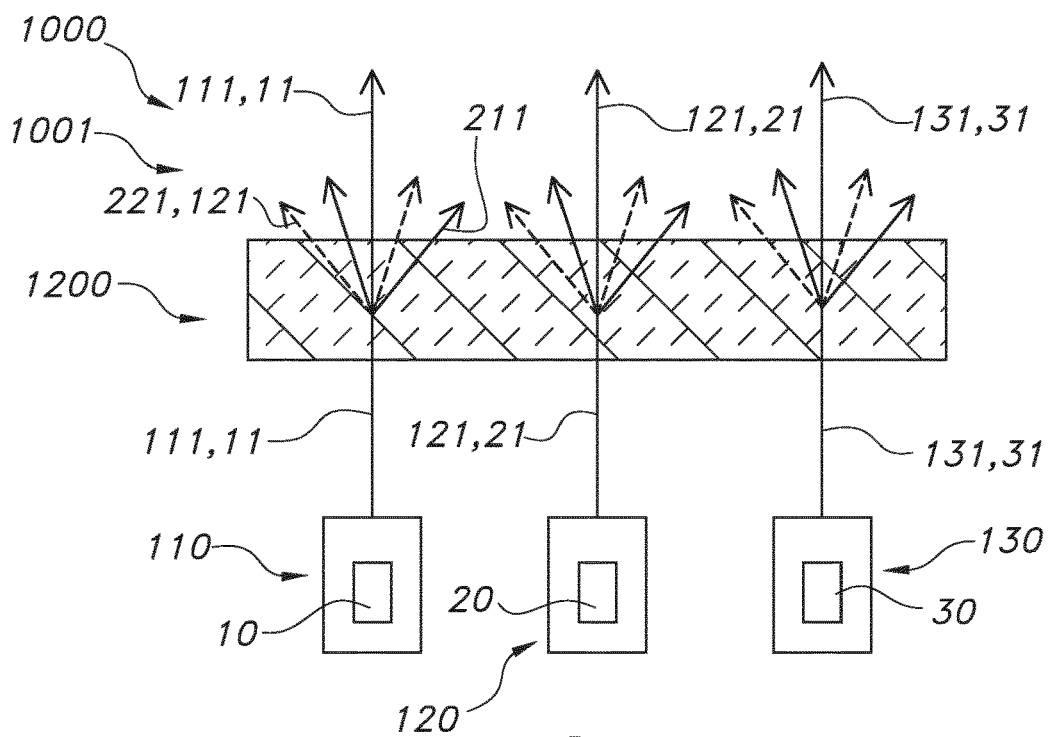

Referring to FIG. 1h, the luminescent body 1200 (also) comprises the second luminescent material 220.

In embodiments, in the first operational mode the device light 1001 has a device light spectral power and the second luminescent material light 221 has a second luminescent material light spectral power, wherein the second luminescent material light spectral power is selected from the range of 1-22% of the total spectral power of the device light spectral power, and wherein the device light has a correlated color temperature selected from the range of 2000-5000 K, such as 2000-4000 K, on or within 10 SDCM from the black body locus.

Figure 2A:
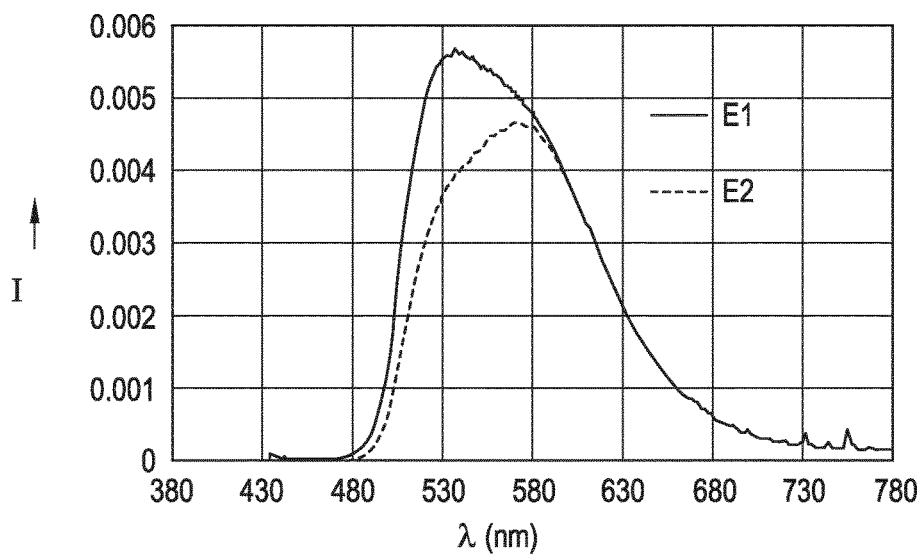
FIGS. 2a-2b show some emission spectra of embodiments.
Figure 2B:
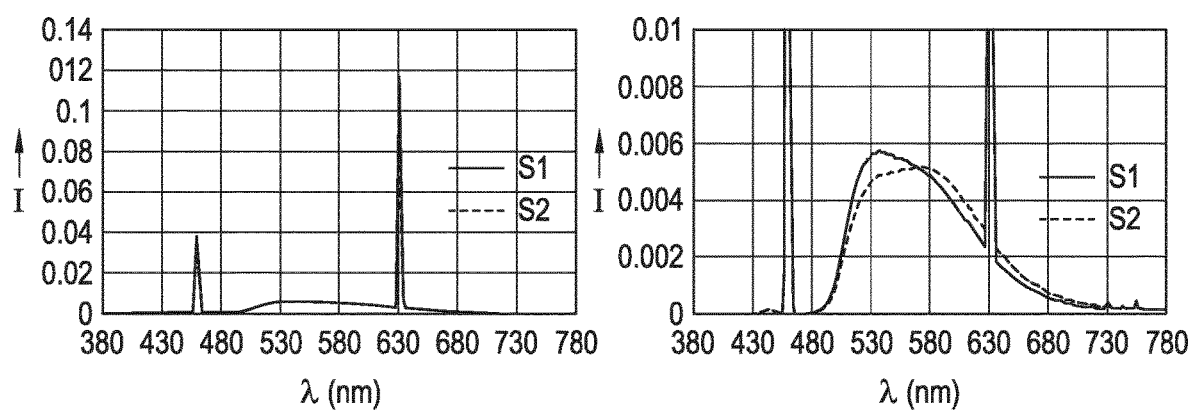

3000 K warm white light may be generated using a YAG garnet phosphor (0.4 mol % Ce), a 460 nm blue laser in combination with a 632 nm red laser. CRI=82 and R9 is equal to 15. It appears that adding some amber/orange-red phosphor to the system (output of amber/orange-red phosphor is only 9% of yellow) and combining this with a red laser of 632 nm yields a CRI of 90 and an R9 of 69; see FIGS. 2a-2b for the spectral compositions comprising these two phosphors. FIG. 2a depicts a ceramic body of YAG:Ce (0.4 mol %) without re-absorption (E1 curve) and after re-absorption by amber/orange-red phosphor (E2 curve; phosphor is not excited by blue LED). Phosphor emission is red shifted by 25 pts in CIE u'. When generating a 3000K spectrum using these two phosphors in combination with a blue laser only, results in a CRI of 68 and an R9 of −45. The amber/orange-red contribution to the spectrum would be 35%. So we only generate a small amount of amber/orange-red phosphor light, the additional red shift of the spectrum is caused by re-absorption of yellow light and red laser light (FIG. 2a). FIG. 2b shows the spectral power distribution of a 3000K light source using a ceramic body of YAG in combination with 460 nm blue laser and 632 nm red laser (S1). In the S2 case some amber/orange-red phosphor was added. In the 51 case, CRI=82 and R9=15. In the S2 case: CRI=90 and R9=69. The right drawing in FIG. 2b is an enlargement of the left drawing in FIG. 2b.

As in a previous case optical component can be attached at the exit (top) side of the package facilitation additional cooling of the top phosphor component.

Figure 3A:
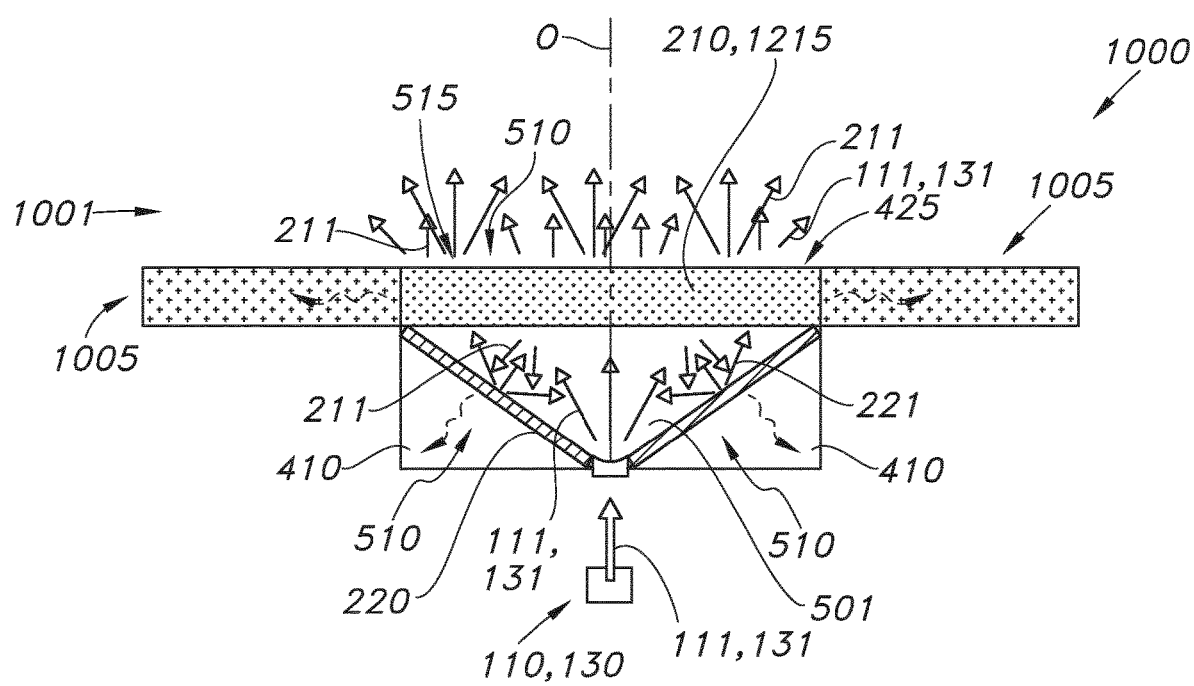
FIGS. 3a-3c schematically depict some embodiments and variants.

In embodiments the amber/orange-red and yellow/green phosphor may not be in the immediate contact and arranged in a mixing chamber (FIG. 3a). This may assist in further reducing the level of pump optical power density on the amber/orange-red phosphor and gives a possibility to split thermal management path for the two phosphor systems. Especially, the main blue pump light excites green/yellow phosphor locate in the exit window. Blue light can enter the mix box through the small optical window or lens component (e.g. negative or a free-form lens) spreading the excitation light on a green/yellow phosphor uniformly. Blue light is partially converted in a phosphor and partially transmitted to the output direction. Part of the green/yellow light (approximately 50%) is being re-emitted back into the mixing chamber where it excites amber/orange-red phosphor. Blue light is also partially reflected from the green/yellow phosphor due to Fresnel reflection and scattering in the phosphor. This back reflected blue and green/yellow light excites the amber/orange-red phosphor which is located on the sides of the mix box. The thickness and the area of the amber/orange-red phosphor is tuned to absorb at least part of the incident green/yellow and blue light, especially the short wavelength side of the emission band. The amber/orange-red light emitted into a mix box goes through the green/yellow phosphor towards the output.

The shape of the mixing chamber is not limited to the one schematically depicted in the FIG. 3a. The ratio of the height to the width dimensions of the mixing chamber, the inclination of the walls (can be also straight walls) as well as the dimensions of the exit window with respect to the laser light entrance can be optimized for maximum efficiency, required source brightness and the amount of area needed for the amber/orange-red phosphor.

This architecture where green/yellow and amber/orange-red phosphors are not with immediate contact with each other provides the possibility to split thermal management paths. For instance, green/yellow phosphor can be embedded (co-sintered) in the ceramic plate and cooled from the sides or attached to the optical component at the exit with good thermal conductivity (top cooling). The amber/orange-red phosphor can be attached to the side walls of the mix box constituting a separate heatsink. The mix box can comprise different types of amber/orange-red phosphors attached to different side walls, or combination of red and amber phosphor.

Hence, FIG. 3a schematically depicts an embodiment of the lighting device 1000 comprising a light mixing chamber 500. The light mixing chamber 500 comprises an envelope 510 and a chamber window 515, together defining a chamber volume 501. In the schematically depicted embodiment, the envelope 510 comprises (at least part of) the second luminescent material 220 and the chamber window 515 comprises (at least part of) the first luminescent material 210. The chamber window 515 may comprise the radiation exit face 425.

Further, a variant is schematically depicted wherein one or more of the following applies: (i) equal to or less than 10% of the first surface area A1 may be in thermal contact with the second luminescent material 220, and (ii) equal to or less than 10% of the second surface area A2 may be in thermal contact with the first luminescent material 210.

Further, a variant is schematically depicted wherein the first luminescent material 210 is configured in thermal contact with a second thermally conductive element 420, and wherein the second luminescent material 220 is configured in thermal contact with the first thermally conductive element 410. Especially, the first thermally conductive element 410 and the second thermally conductive element 420 may not be in thermal contact with each other.

Figure 3B:
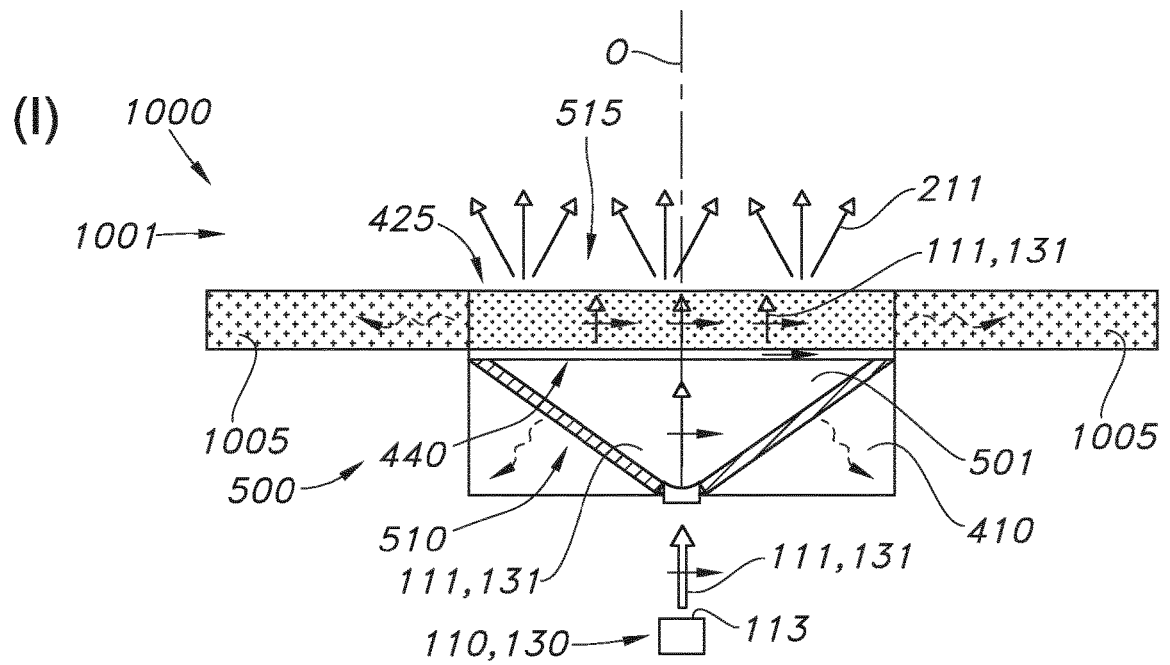
Figure 3B:
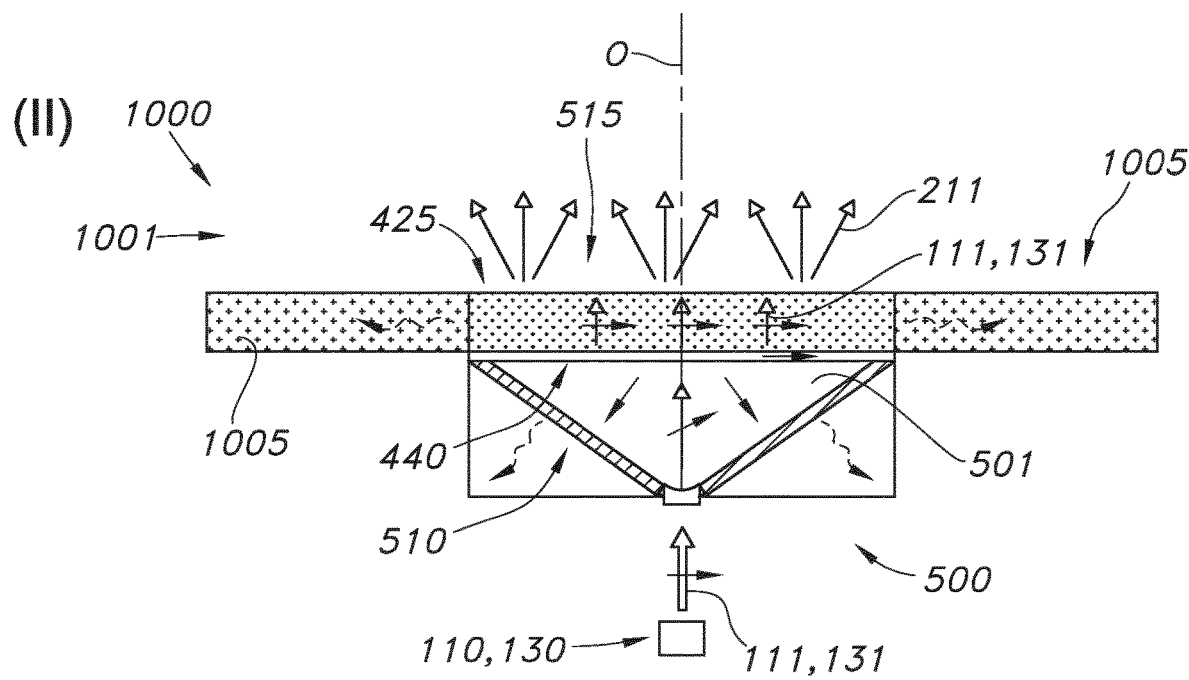

In embodiments, the amount of blue laser light exciting the green/yellow phosphor and reflecting towards the amber/orange-red phosphor can be tuned, providing the way to realize color point tunable architecture. This tuneability can be achieved using reflective polarizer element just below the green/yellow phosphor (in between green/yellow and red converters)(see FIG. 3b); the reflective polarizer is indicated with reference 440. When polarization direction of blue laser coincides with allowed direction for polarizer, almost all blue light will be transmitted towards the green/yellow phosphor. In case these two orientations will be misaligned the blue pump, light will be partially transmitted to the green/yellow and partially reflected towards amber/orange-red phosphor, allowing to tune a color point. The tuning can be realized for instance keeping the reflective polarizer element fixed in the mixing box and rotating (e.g. mechanically) the orientation of the blue laser and its polarization plane with respect to a mix box. Examples of such a reflective polarizers can be DBEF foil of 3M or glass-based wire grid (e.g. by Moxtec) polarizer component. FIG. 3b schematically depicts a color-tunable embodiment with reflective polarizer with aligned (left) and misaligned (right) polarization directions.

In embodiments, an alternative way to release thermal and optical load on the amber/orange-red phosphor is to use additional red laser (in the wavelength range of 630-635 nm). This also allow to tune the spectral color point and helps in additional increase of CRI of the light source. The architecture can be similar to embodiment 1 where red laser light can be set to propagate collinearly/combined with the blue laser. The same is possible in the architecture of the embodiment as described in relation to FIG. 3a.

In versions of the embodiment described in relation to FIG. 3b, when a red laser enters the mix box, the orientation of its polarization plane may not coincide with the one of the blue laser. In case the polarization planes of the blue and red lasers with respect to the mix box comprising reflective polarizer can be set (rotated) independently, larger freedom in color tuneability can be obtained.

In embodiments, other combinations with more lasers to achieve color tunable system are possible. In addition to the main pump blue laser the red or amber phosphor can be pumped through a side of a mix box (transparent heatsink with dichroic reflector or laser entering through a tiny hole into a chamber) by another, e.g. green laser. Or alternatively, a red laser can also enter though the side of the mix box which either contains or is free from the phosphor. Possible configurations for mix box geometries with multiple lasers are presented in FIG. 3c. However, also other configuration can be chosen to include light source light of the light sources than schematically depicted in FIG. 3c (see e.g. also FIG. 4).

Figure 3C:
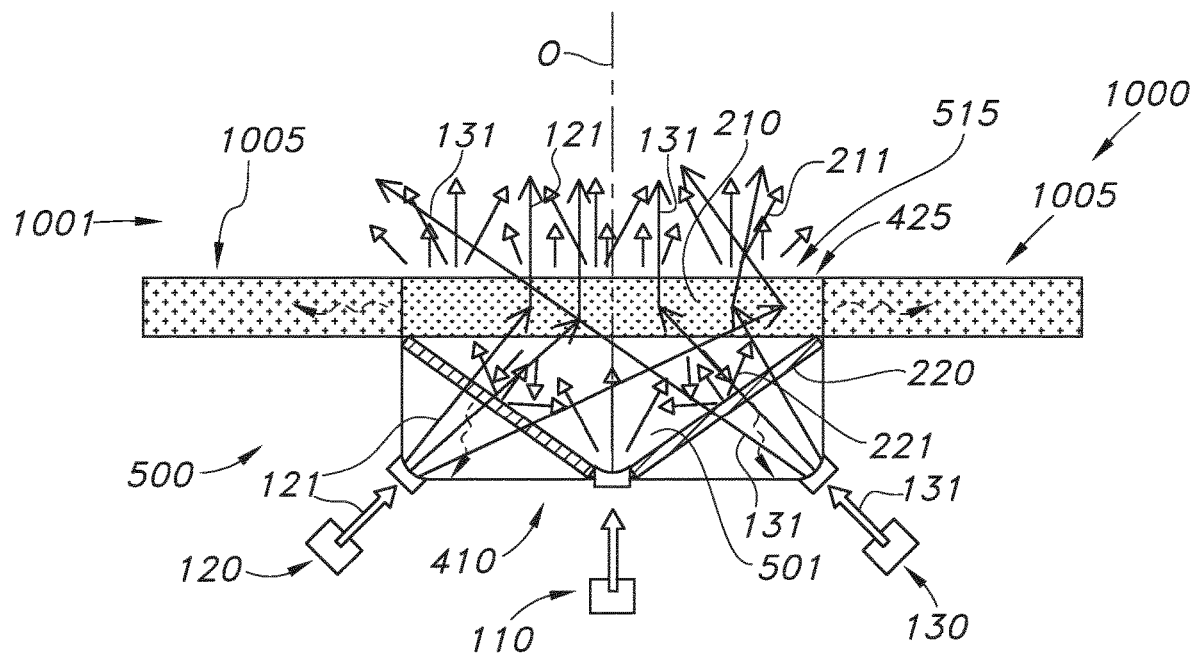

Referring to e.g. FIGS. 3a-3c, one layer may be curved (second luminescent material) and another layer may be planar (first luminescent material). For instance, one layer may have a conical shape, and another layer may be planer. However, the shape of the second luminescent material may also be pyramidal (and of the first luminescent material rectangular).

Many of the above schematically depicted embodiments show embodiments of the lighting device 1000, wherein the second luminescent material 220 is configured to convert one or more of (i) part of the first luminescent material light 211 and (ii) part of the first light source light 111 into second luminescent material light 221 (having a second luminescent material light spectral power distribution different from the first luminescent material light spectral power distribution, wherein the second luminescent material light 221) having one or more wavelengths in the amber-red wavelength range. Further, especially the second luminescent material 220 may be configured to convert part of the first luminescent material light 211 and part of the first light source light 111 into second luminescent material light 221. Yet further, especially the first converter material 215 may be at least partly transmissive for the first light source light 111. Yet further, in specific embodiments one or more of the first luminescent material 210 and the second luminescent material 220 are provided as ceramic body.

The device 1000 especially may comprise the first luminescent material 210 configured to convert at least part of the first light source light 111 into first luminescent material light 211. The luminescent material light 211 may have an emission band having wavelengths in one or more of the green spectral wavelength range and the yellow spectral wavelength range. Especially, the first luminescent material 210 may comprise a luminescent material of the type $A_3B_5O_{12}$:Ce, wherein A comprises one or more of Y, Gd, Tb and Lu, and wherein B comprises one or more of Al, Ga, and In, wherein A comprises at least Y, and wherein B comprises at least Al. As indicated above, the luminescent material 210 may comprise $Y_{x1-x2-x3}A_{x2}A_{x2}Ce_{x33}Al_{y1-y2}B_{y25}O_{12}$, wherein x1+x2+x3=1, wherein x3>0, wherein 0<x2+x3≤0.2, wherein y1+y2=1, wherein 0≤y2≤0.2, wherein A comprises one or more elements selected from the group consisting of lanthanides and scandium, and wherein B comprises one or more elements selected from the group consisting of Ga and In, wherein at maximum 10% of Al—O may be replaced by Si—N. Especially, x3 is selected from the range of 0.001-0.1, wherein 0<x2+x3≤0.1, and wherein 0≤y2≤0.1. Especially, x3 is selected from the range of 0.001-0.1, wherein 0<x2+x3<0.1, and wherein 0≤y2≤0.1. In specific embodiments, the first luminescent material light 211 has a first dominant wavelength $\lambda_{d1}$ selected from the range of 555-580 nm.

Figure 4:
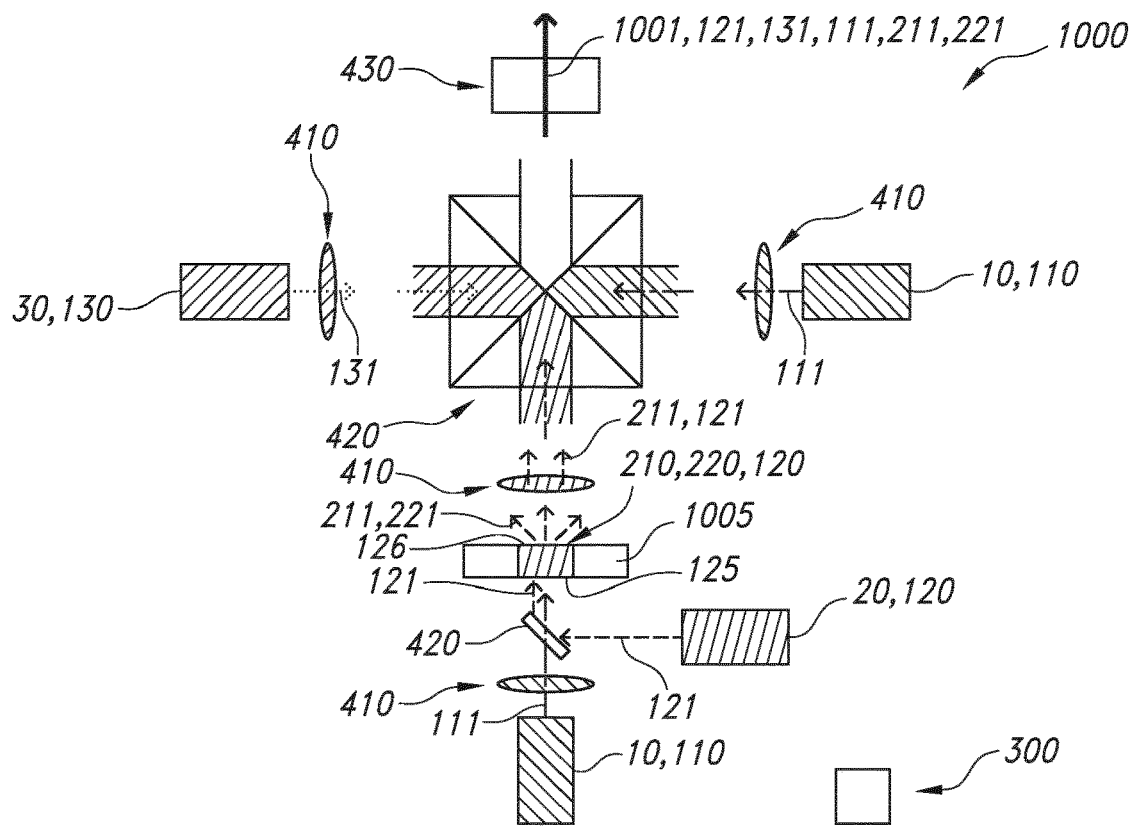
FIG. 4 schematically depict a further embodiments.

FIG. 4 schematically depicts a further embodiments, as well as some variants.

The second light source 120 may be configured upstream of the first luminescent material 210. Hence, the luminescent material 210 may be transmissive for the second light source light 121. Further, the third light source 130 is configured to generate the third light source light 131 that bypasses the first luminescent material 210.

Reference 125 indicates a radiation input face and reference 126 indicates a radiation exit face.

For cooling the first luminescent material 210 a heat sink may be applied, which is (very schematically) indicated with reference 1005. One or more heat sinks 1005 may be thermally coupled with one or more of the light sources 110,20,130 and/or with the luminescent material 210.

The light generating device 1000 may be configured to combine and/or homogenize the second light 21 and the first luminescent material light 211 (downstream of the first luminescent material 210). For instance, optical elements 420 may be applied to introduce the second light source light 121 and/or the third light source light 131. Optical element 420 may e.g. be a dichroic mirror or dichroic combiner. Optical element 420 may also be a combination of a plurality of dichroic mirrors or dichroic combiners. The device 1000 further optionally comprises an optical element 430 configured to combine and/or homogenize optionally unconverted first light source light 111, the second light 12, the third light source light 131, and the first luminescent material light 211, to provide device light 1001. In specific embodiments, the optical element 430 may comprises one or more of (i) a dichroic beam combiner and (ii) an optical homogenizer. The optical element 430 may alternatively or additionally be configured to beam shape the device light 1001 and/or configured to homogenize the device light 1001. As schematically depicted the optical element 430 is configured downstream of the first luminescent material 210. For instance, the optical element 430 may comprise a CPC like optical element. The optical element 430 may include one or more of reflective and transmissive optics. In the schematic drawings, transmissive optics are schematically depicted, but this should not be interpreted as being limited to transmissive optics.

The device 1000 further comprises in embodiments a control system 300 configured to control the second laser light source 20 and/or one or more of the other light sources 110 and 130.

The control system 300 is especially configured to control one or more of the correlated color temperature and the color rendering index of the device light 1001, such as especially by controlling the first light source 110, the third light source 130, and optionally the second laser light source 20. In an operational mode of the light generating device 1000, the light generating device 1000 is configured to generate the device light 1001 with a brightness of at least 2000 lm/mm².

By way of example, in the schematically depicted embodiment of FIG. 4 the first luminescent material 210 and a second luminescent material 220 are applied both. They may e.g. be combined in a single body. However, other embodiments with multilayers, or even yet other embodiments similar to the introduction of the other colors, may be applied. The second luminescent material 220 is configured to generate second luminescent material light 221. This may e.g. be amber or orange second luminescent material light 221. This may (further) increase the CRI.

Focusing may be executed with one or more optics, like (focusing) lenses. Especially, two lenses may be applied to focus the laser light source light. Collimation may be executed with one or more (other) optics, like collimation elements, such as lenses and/or parabolic mirrors. References 410 indicate optics that may be used for focusing and/or collimation. Though a single lens is depicted, other types of lenses, a plurality of lenses, may also be applied, as reference 410 indicate optics, especially focusing and/or collimation optics, in general, especially the optics 410 may comprise focusing optics.

Referring to FIGS. 1a-4, alternatively also reflective configurations may be applied.

Figure 5:
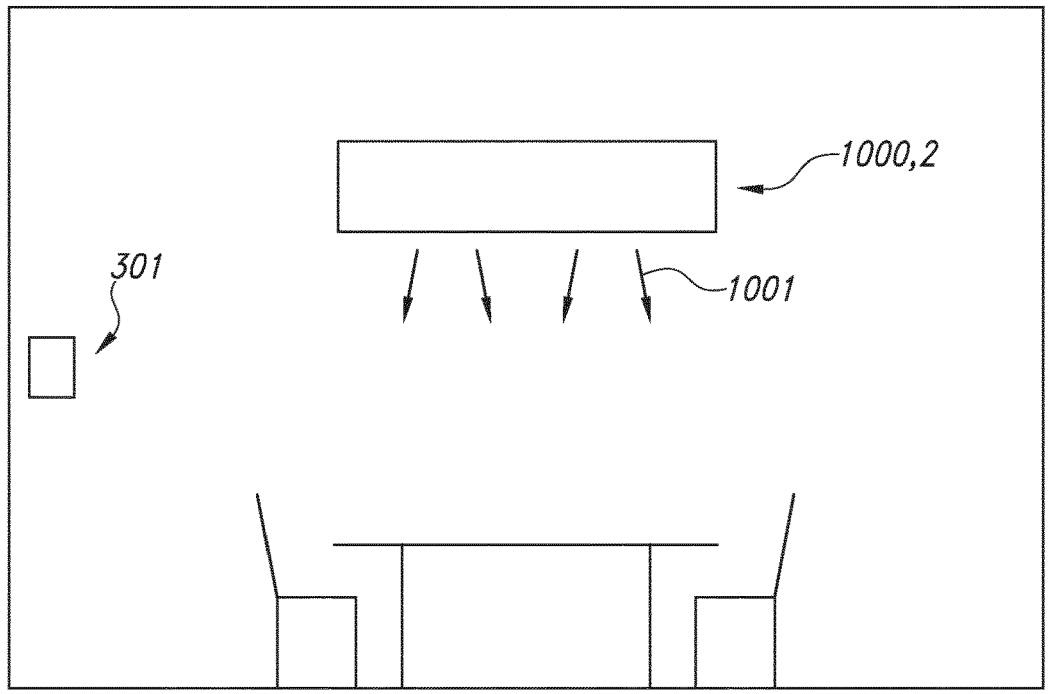
FIG. 5 schematically depicts a further embodiment.

FIG. 5 schematically depicts an embodiment of a luminaire 2 comprising the light generating device 1000 as described above. Reference 301 indicates a user interface which may be functionally coupled with the control system (not depicted) comprised by or functionally coupled to the lighting system 1000.

Figure 6:
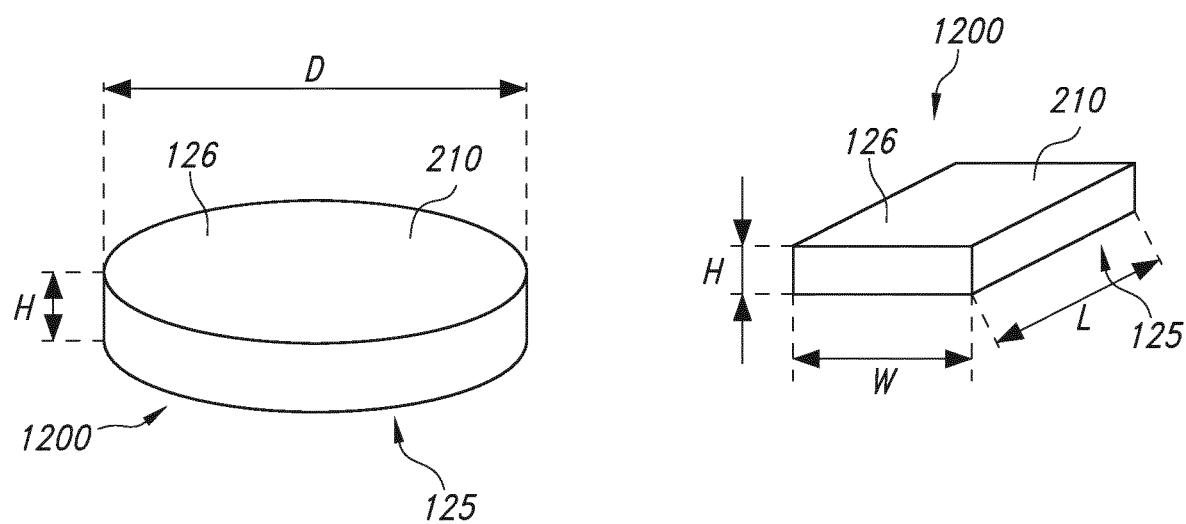
FIG. 6 schematically depicts some embodiments of the luminescent material (body).

FIG. 6 schematically depict some embodiments of the luminescent material 210. Here, embodiments are depicted wherein the luminescent material is provided as body 1200 (see also above). The height is indicated with reference H, the width with reference W, the length with reference L, and the diameter with reference D. Note that in embodiments the body 1200 may also comprise two or more luminescent materials, such as the first luminescent material 210 and the second luminescent material 220. Hence, optionally reference 210 may also be interpreted as the first luminescent material 210 and the second luminescent material 220.

In an example, the power emitted by the different light sources moved along the BBL. The CCT was changed by changing red, orange/amber, green/yellow and blue contributions. Amongst others, 0.4% Ce YAG, an orange luminescent material, and an amber LED ware applied. Results for different CCTs and combinations are indicated in the tables below:

| Red laser, Orange/yellow laser, blue Laser and YAG:Ce | | | | |
|---|---|---|---|---|
| CCT(K) | 2378 | 2750 | 3309 | 3862 |
| CRI | 91 | 91 | 91 | 90 |
| R9 | 44 | 63 | 71 | 84 |
| LE (Lm/W) | 329 | 309 | 316 | 314 |

-continued

| Red laser, Orange/yellow laser, blue Laser and YAG:Ce | | | | |
|---|---|---|---|---|
| CCT(K) | 2378 | 2750 | 3309 | 3862 |
| Red nm % | 640 nm (30%) | 640 nm (31%) | 640 nm (23%) | 640 nm (18%) |
| Orange nm % | 600 nm (16%) | 600 nm (6%) | 600 nm (3%) | 600 nm (2%) |
| Blue nm % | 460 nm (6%) | 460 nm (8%) | 460 nm (12%) | 460 nm (16%) |
| YAG phosphor % | 48% | 55% | 62% | 64% |

| Red laser, Orange/yellow laser, blue Laser and YAG:Ce | | | | |
|---|---|---|---|---|
| CCT(K) | 2389 | 2607 | 3051 | 3927 |
| CRI | 92 | 91 | 93 | 90 |
| R9 | 60 | 88 | 68 | 61 |
| LE (Lm/W) | 307 | 302 | 315 | 313 |
| Red nm % | 650 nm (27%) | 650 nm (28%) | 650 nm (20%) | 650 nm (13%) |
| Orange nm % | 610 nm (17%) | 610 nm (13%) | 610 nm (11%) | 610 nm (7%) |
| Blue nm % | 450 nm (6%) | 450 nm (6%) | 460 nm (11%) | 465 nm (19%) |
| YAG phosphor % | 50 | 53 | 58 | 61 |

| Red laser, Orange/yellow laser, blue Laser and LuAG:Ce | | | | |
|---|---|---|---|---|
| CCT(K) | 2549 | 2700 | 3460 | 4351 |
| CRI | 91 | 94 | 97 | 95 |
| R9 | 9 | 76 | 78 | 85 |
| LE (Lm/W) | 312 | 328 | 330 | 323 |
| Red nm % | 635 nm (16%) | 635 nm (36%) | 28% (635 nm) | 635 nm (22%) |
| orange nm % | 580 nm (17%) | 590 nm (15%) | 12% (590 nm) | 590 nm (9%) |
| Blue nm % | 450 nm (5%) | 450 nm (5%) | 10% (450 nm) | 450 nm (6%) |
| LuAG % | 37% | 44% | 50% | 53% |

| Different compositions with orange phosphor | | | | |
|---|---|---|---|---|
| CCT (K) | 2345 | 2692 | 3162 | 4000 |
| CRI | 92 | 92 | 92 | 90 |
| R9 | 79 | 70 | 83 | 88 |
| LE | 323 | 330 | 333 | 330 |
| Red 630% | 29 | 26 | 20 | 12 |
| Blue 460% | 5 | 8 | 12 | 18 |
| Ce:YAG % | 51 | 58 | 62 | 66 |
| Orange ($\lambda_d$ 596 nm) % | 15 | 8 | 6 | 4 |

The term "plurality" refers to two or more.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%.

The term "comprise" includes also embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices, apparatus, or systems may herein amongst others be described during operation. As will be clear to the person skilled in the art, the invention is not limited to methods of operation, or devices, apparatus, or systems in operation.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A light generating device configured to generate device light, wherein the light generating device comprises a first light source, a first luminescent material, a second source of second light, and a third light source, wherein:
   the first light source is configured to generate blue first light source light having a first peak wavelength $\lambda_1$ selected from the spectral wavelength range of 440-475 nm, wherein the first light source is a first laser light source;
   the first luminescent material is configured to convert at least part of the first light source light into first luminescent material light having an emission band having wavelengths in one or more of (a) the green spectral wavelength range and (b) the yellow spectral wavelength range, wherein the first luminescent material comprises a luminescent material of the type $A_3B_5O_{12}$:Ce, wherein A comprises one or more of Y, Gd, Tb and Lu, and wherein B comprises one or more of Al, Ga, and In, wherein A comprises at least Y, and wherein B comprises at least Al;
   the second source of second light is configured to provide the second light having an emission band having a dominant wavelength or peak wavelength in the spectral wavelength range of 580-610 nm;
   the third light source is configured to generate red third light source light having a third peak wavelength $\lambda_3$ selected from the spectral wavelength range of 630-670 nm, wherein the third light source is a third laser light source;
   the light generating device is configured to provide in a first operational mode white device light comprising the first light source light, the first luminescent material light, the second light, and the third light source light, with a correlated color temperature selected from the range of 2000-4000 K and a color rendering index of at least 80.

2. The light generating device according to claim 1, wherein $\lambda_1$ is selected from the spectral wavelength range of 450-470 nm and wherein $\lambda_3$ is selected from the spectral wavelength range of 635-650 nm.

3. The light generating device according to claim 1, wherein the second source of second light comprises a second laser light source configured to generate second laser light source light, wherein the second laser light source light has a second peak wavelength $\lambda_2$ selected from the spectral wavelength range of 590-600 nm.

4. The light generating device according to claim 1, wherein the first luminescent material comprises $(Y_{x1-x2-x3}A_{x2}Ce_{x3})_3(Al_{y1-y2}B_{y2})_5O_{12}$, wherein x1+x2+x3=1, wherein x3>0, wherein 0<x2+x3≤0.2, wherein y1+y2=1, wherein 0≤y2≤0.2, wherein A comprises one or more elements selected from the group consisting of lanthanides and scandium, wherein B comprises one or more elements selected from the group consisting of Ga and In, wherein at maximum 10% of Al—O may be replaced by Si—N; and wherein the first luminescent material light has a first dominant wavelength ($\lambda_{d1}$) selected from the spectral wavelength range of 555-580 nm.

5. The light generating device according to claim 1, comprising a luminescent body, wherein the luminescent body comprises the first luminescent material.

6. The light generating device according to claim 5, wherein the luminescent body comprises one or more of a ceramic body and a multi-layer material.

7. The light generating device according to claim 1, wherein the second source of second light comprises a second luminescent material configured to convert one or more of the first light source light and the first luminescent material light into second luminescent material light, wherein the second luminescent material light has a dominant wavelength in the spectral wavelength range of 580-610 nm.

8. The light generating device according to claim 7, wherein the first light source, the first luminescent material, and the second luminescent material are configured such that at least part of the first light source light can only reach the second luminescent material after one or more of (i) scattering by the first luminescent material, (ii) reflection by the first luminescent material, and (iii) transmission through the first luminescent material.

9. The light generating device according to claim 8, wherein the first light source light has an optical axis, wherein the optical axis is incident on the first luminescent material and is not incident on the second luminescent material.

10. The light generating device according to claim 5, wherein the luminescent body comprises the second luminescent material.

11. The light generating device according to claim 7, wherein the second luminescent material is configured to convert at least part of the first luminescent material light into second luminescent material light.

12. The light generating device according to claim 7, wherein in the first operational mode the device light has a device light spectral power and the second luminescent material light has a second luminescent material light spectral power, wherein the second luminescent material light spectral power is selected from the range of 1-22% of the total spectral power of the device light spectral power, and wherein the device light has a correlated color temperature selected from the range of 2000-4000 K on or within 10 SDCM from the black body locus.

13. The light generating device according to claim 1, further comprising an optical element configured to combine the first light source light, the first luminescent material light, the second light, and the third light source light.

14. The light generating device according to claim 1, further comprising a control system, wherein the control system is configured to control one or more of the correlated color temperature and the color rendering index of the device light by controlling the first light source, the third light source, and optionally the second laser light source.

15. A luminaire comprising the light generating device according to claim 1.

* * * * *